United States Patent
Kato et al.

(10) Patent No.: US 10,360,960 B2
(45) Date of Patent: Jul. 23, 2019

(54) MAGNETIC MEMORY DEVICE

(71) Applicant: Kabushiki Kaisha Toshiba, Minato-ku (JP)

(72) Inventors: Yushi Kato, Chofu (JP); Soichi Oikawa, Hachioji (JP); Mizue Ishikawa, Yokohama (JP); Yoshiaki Saito, Kawasaki (JP); Hiroaki Yoda, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/700,485

(22) Filed: Sep. 11, 2017

(65) Prior Publication Data

US 2018/0174634 A1    Jun. 21, 2018

(30) Foreign Application Priority Data

Dec. 16, 2016    (JP) .................. 2016-244038

(51) Int. Cl.

| G11C 11/15 | (2006.01) |
| G11C 11/16 | (2006.01) |
| H01L 43/04 | (2006.01) |
| H01L 43/10 | (2006.01) |
| H01L 43/14 | (2006.01) |
| G11C 11/56 | (2006.01) |

(Continued)

(52) U.S. Cl.
CPC ............ *G11C 11/15* (2013.01); *G11C 11/161* (2013.01); *G11C 11/1653* (2013.01);
(Continued)

(58) Field of Classification Search
CPC ... G11C 11/15; G11C 11/161; G11C 11/5685; G11C 11/16; H01L 43/14; H01L 43/04; H01L 43/10
See application file for complete search history.

(56) References Cited

U.S. PATENT DOCUMENTS 9,691,458 B2 * 6/2017 Ralph .................. G11C 11/18
2004/0257865 A1   12/2004 Honjo et al.
(Continued)

FOREIGN PATENT DOCUMENTS

| JP | 2005-19457 A | 1/2005 |
| JP | 2013-48210 A | 3/2013 |

(Continued)

OTHER PUBLICATIONS

Jun Liu, et al., "Correlation between the Spin Hall Angle and the Structural Phases of Early 5d Transition Metals", Applied Physics Letters, vol. 107 No. 23, 2015, pp. 232408-1-232408-5 with cover page.

*Primary Examiner* — David Lam
(74) *Attorney, Agent, or Firm* — Oblon, McClelland, Maier & Neustadt, L.L.P.

(57) ABSTRACT

According to one embodiment, a magnetic memory device includes a conductive layer, a first magnetic layer, a second magnetic layer, a first nonmagnetic layer, and a controller. The conductive layer includes a first portion, a second portion, and a third portion between the first and second portions. The first magnetic layer is separated from the third portion. The second magnetic layer is provided between the third portion and the first magnetic layer. The first nonmagnetic layer is provided between the first and second magnetic layers. The controller is electrically connected to the first and second portions. The third portion includes a first region and a second region. The second region is provided between the first region and the second magnetic layer. The controller implements a first operation of supplying a first current to the conductive layer, and a second operation of supplying a second current to the conductive layer.

19 Claims, 27 Drawing Sheets

(51) Int. Cl.
*H01L 43/08* (2006.01)
*G11C 11/155* (2006.01)
*H01L 27/22* (2006.01)

(52) U.S. Cl.
CPC ...... *G11C 11/1655* (2013.01); *G11C 11/1657* (2013.01); *G11C 11/1659* (2013.01); *G11C 11/1675* (2013.01); *G11C 11/5685* (2013.01); *H01L 43/04* (2013.01); *H01L 43/08* (2013.01); *H01L 43/10* (2013.01); *H01L 43/14* (2013.01); *G11C 11/155* (2013.01); *H01L 27/228* (2013.01)

(56) References Cited

U.S. PATENT DOCUMENTS

| | | |
|---|---|---|
| 2013/0307099 A1 | 11/2013 | Kitagawa et al. |
| 2014/0056060 A1 | 2/2014 | Khvalkovskiy et al. |
| 2014/0131824 A1 | 5/2014 | Kitagawa et al. |
| 2014/0269036 A1 | 9/2014 | Pi et al. |
| 2016/0196860 A1 | 7/2016 | Buhrman et al. |
| 2017/0069365 A1* | 3/2017 | Buhrman ................ G11C 11/18 |
| 2017/0076770 A1 | 3/2017 | Daibou et al. |
| 2017/0222135 A1 | 8/2017 | Fukami et al. |
| 2018/0040807 A1 | 2/2018 | Saito et al. |

FOREIGN PATENT DOCUMENTS

| | | |
|---|---|---|
| JP | 2013-243220 A | 12/2013 |
| JP | 2014-45196 A | 3/2014 |
| JP | 5985728 B1 | 9/2016 |
| WO | WO 2016/021468 A1 | 2/2016 |
| WO | WO 2016/159017 A1 | 10/2016 |

* cited by examiner

MAGNETIC MEMORY DEVICE

CROSS-REFERENCE TO RELATED APPLICATIONS

This application is based upon and claims the benefit of priority from Japanese Patent Application No. 2016-244038, filed on Dec. 16, 2016; the entire contents of which are incorporated herein by reference.

FIELD

Embodiments described herein relate generally to a magnetic memory device.

BACKGROUND

There is a magnetic memory device that uses a magnetic layer. It is desirable to reduce the write current of the magnetic memory device.

DETAILED DESCRIPTION

Figure 1:
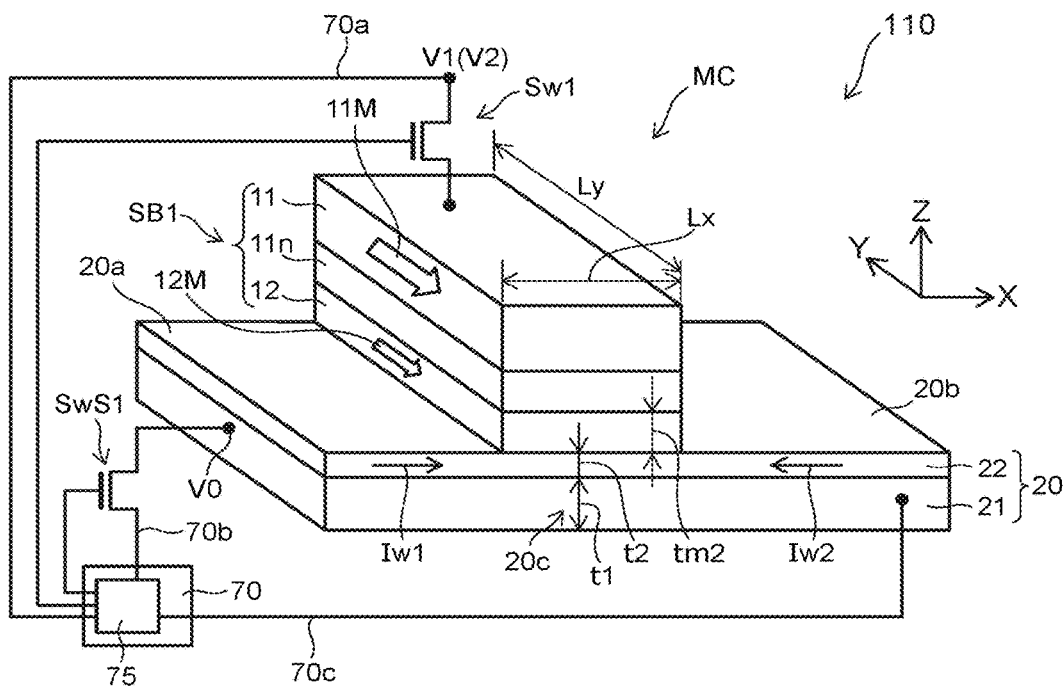
FIG. 1 is a schematic perspective view illustrating a magnetic memory device according to a first embodiment.

According to one embodiment, a magnetic memory device includes a conductive layer, a first magnetic layer, a second magnetic layer, a first nonmagnetic layer, and a controller. The conductive layer includes a first portion, a second portion, and a third portion between the first portion and the second portion. The first magnetic layer is separated from the third portion in a first direction crossing a second direction being from the first portion toward the second portion. The second magnetic layer is provided between the third portion and the first magnetic layer. The first nonmagnetic layer is provided between the first magnetic layer and the second magnetic layer. The controller is electrically connected to the first portion and the second portion. The third portion includes a first region and a second region. The second region is provided between the first region and the second magnetic layer and includes a first metal and boron. The first region does not include boron, or a first concentration of boron in the first region is lower than a second concentration of boron in the second region. A thickness along the first direction of the second region is not less than 1 nanometer and not more than 7 nanometers. The controller implements a first operation of supplying a first current to the conductive layer from the first portion toward the second portion, and a second operation of supplying a second current to the conductive layer from the second portion toward the first portion.

According to another embodiment, a magnetic memory device includes a conductive layer, a first magnetic layer, a second magnetic layer, a first nonmagnetic layer, and a controller. The conductive layer includes a first portion, a second portion, and a third portion between the first portion and the second portion. The first magnetic layer is separated from the third portion in a first direction crossing a second direction being from the first portion toward the second portion. The second magnetic layer is provided between the third portion and the first magnetic layer. The first nonmagnetic layer is provided between the first magnetic layer and the second magnetic layer. The controller is electrically connected to the first portion and the second portion. The third portion includes a first region and a second region. The first region includes a first metal. The second region is provided between the first region and the second magnetic layer and includes the first metal and boron. The first region does not including boron, or a first concentration of boron in the first region is lower than a second concentration of boron in the second region. The controller implements a first operation of supplying a first current to the conductive layer from the first portion toward the second portion, and a second operation of supplying a second current to the conductive layer from the second portion toward the first portion.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1 is a schematic perspective view illustrating a magnetic memory device according to a first embodiment.

As shown in FIG. 1, the magnetic memory device 110 according to the embodiment includes a conductive layer 20, a first magnetic layer 11, a second magnetic layer 12, a first nonmagnetic layer 11n, and a controller 70.

The conductive layer 20 includes a first portion 20a, a second portion 20b, and a third portion 20c. The third portion 20c is positioned between the first portion 20a and the second portion 20b. The conductive layer 20 is nonmagnetic, for example. The first portion 20a, the second portion 20b, and the third portion 20c are non-magnetic, for example.

The first magnetic layer 11 is separated from the third portion 20c in a first direction. The first direction crosses a second direction from the first portion 20a toward the second portion 20b.

The first direction is taken as a Z-axis direction. One direction perpendicular to the Z-axis direction is taken as an X-axis direction. A direction perpendicular to the Z-axis direction and the X-axis direction is taken as a Y-axis direction. In the example, the second direction is the X-axis direction.

The second magnetic layer 12 is provided between the third portion 20c and the first magnetic layer 11. The first nonmagnetic layer 11n is provided between the first magnetic layer 11 and the second magnetic layer 12. Another layer may be provided between the first nonmagnetic layer 11n and the first magnetic layer 11. Another layer may be provided between the first nonmagnetic layer 11n and the second magnetic layer 12.

The first magnetic layer 11 functions as, for example, a reference layer. The second magnetic layer 12 functions as, for example, a memory layer (e.g., a free layer, or a storage layer). A second magnetization 12M of the second magnetic layer 12 changes more easily than a first magnetization 11M of the first magnetic layer 11. The orientation of the second magnetization 12M of the second magnetic layer 12 corresponds to information to be stored. The orientation of the magnetization corresponds to, for example, the orientation of the easy magnetization axis.

The first magnetic layer 11, the first nonmagnetic layer 11n, and the second magnetic layer 12 are included in a first stacked body SB1. The first stacked body SB1 functions as, for example, at least a portion of one memory cell MC. The first stacked body SB1 includes a magnetic tunnel junction (MTJ). The first stacked body SB1 corresponds to a MTJ element.

In the example, a length Ly along a third direction of the first magnetic layer 11 is longer than a length Lx along the second direction of the first magnetic layer 11. The third direction crosses the first direction and the second direction. The third direction is, for example, the Y-axis direction. Shape anisotropy occurs in the first magnetic layer 11 and the second magnetic layer 12. For example, the first magnetization 11M of the first magnetic layer 11 is aligned with the Y-axis direction. For example, the second magnetization 12M of the second magnetic layer 12 is oriented in the +Y direction or the −Y direction. In the embodiment as described below, the relationship between the length Ly and the length Lx is arbitrary. In the embodiment, the orientations of the magnetizations are arbitrary.

The controller 70 is electrically connected to the first portion 20a and the second portion 20b. In the example, the controller 70 includes a control circuit 75. The control circuit 75 (the controller 70) and the first portion 20a are electrically connected by an interconnect 70b. The control circuit 75 (the controller 70) and the second portion 20b are electrically connected by an interconnect 70c. In the example, a switch SwS1 is provided in a current path (the interconnect 70b) between the control circuit 75 and the first portion 20a. The gate (the control terminal) of the switch SwS1 is electrically connected to the control circuit 75.

In the example, the control circuit 75 (the controller 70) is electrically connected to the first magnetic layer 11. The control circuit 75 (the controller 70) and the first magnetic layer 11 are electrically connected by an interconnect 70a. In the example, a switch Sw1 is provided in a current path (the interconnect 70a) between the control circuit 75 and the first magnetic layer 11. The gate (the control terminal) of the switch Sw1 is electrically connected to the control circuit 75.

These switches may be included in the controller 70. The potentials of the conductive layer 20 and the first stacked body SB1 are controlled by the controller 70.

For example, the first portion 20a is set to a reference potential V0; and a first voltage V1 (e.g., a select voltage) is applied to the first magnetic layer 11. At this time, for example, the electrical resistance of the first stacked body SB1 changes according to the orientation of the current flowing in the conductive layer 20. On the other hand, the first portion 20a is set to the reference potential V0; and a second voltage V2 (e.g., an unselect voltage) is applied to the first magnetic layer 11. The second voltage V2 is different from the first voltage V1. When the second voltage V2 is applied, for example, the electrical resistance of the first stacked body SB1 substantially does not change even when a current flows in the conductive layer 20. The change of the electrical resistance corresponds to the change of the state of the first stacked body SB1. The change of the electrical resistance corresponds to, for example, the change of the orientation of the second magnetization 12M of the second magnetic layer 12. For example, the second voltage V2 is different from the first voltage V1. For example, the absolute value of the potential difference between the reference potential V0 and the first voltage V1 is greater than the absolute value of the potential difference between the reference potential V0 and the second voltage V2. For example, the polarity of the first voltage V1 may be different from the polarity of the second voltage V2. Such an electrical resistance difference is obtained by the control of the controller 70.

For example, the controller 70 performs a first operation and a second operation. These operations are operations when the select voltage is applied to the stacked body SB1. In the first operation, the controller 70 supplies a first current Iw1 to the conductive layer 20 from the first portion 20a toward the second portion 20b (referring to FIG. 1). In the second operation, the controller 70 supplies a second current Iw2 to the conductive layer 20 from the second portion 20b toward the first portion 20a (referring to FIG. 1).

A first electrical resistance between the first magnetic layer 11 and the first portion 20a after the first operation is different from a second electrical resistance between the first magnetic layer 11 and the first portion 20a after the second operation. Such an electrical resistance difference corresponds to, for example, the change of the orientation of the second magnetization 12M of the second magnetic layer 12. For example, the orientation of the second magnetization 12M changes due to the current (the write current) flowing through the conductive layer 20. For example, it is considered that this is based on the spin Hall effect. For example, it is considered that the change of the orientation of the second magnetization 12M is based on spin-orbit coupling.

For example, the second magnetization 12M is caused by the first operation to have a component having the same orientation as the orientation of the first magnetization 11M. A "parallel" magnetization is obtained. On the other hand, the second magnetization 12M is caused by the second operation to have a component having the reverse orientation of the orientation of the first magnetization 11M. An "antiparallel" magnetization is obtained. In such a case, the first electrical resistance after the first operation is lower than the second electrical resistance after the second operation. Such an electrical resistance difference corresponds to the information to be stored. For example, multiple different magnetizations correspond to the information to be stored.

A state of the memory cell MC after the first operation corresponds to a first memory state. A state of the memory cell MC after the second operation corresponds to a second memory state. The first memory state corresponds to one of "0" and "1", for example. The second memory state corresponds to other one of "0" and "1", for example.

The controller 70 may further implement a third operation and a fourth operation. In the third operation, the potential difference between the first portion 20a and the first magnetic layer 11 is set to the second voltage V2; and the first current Iw1 is supplied to the conductive layer 20. In the fourth operation, the potential difference between the first portion 20a and the first magnetic layer 11 is set to the second voltage V2; and the second current Iw2 is supplied to the conductive layer 20. In the third operation and the fourth operation, for example, the electrical resistance of the first stacked body SB1 substantially does not change even when a current flows in the conductive layer 20. The first electrical resistance between the first magnetic layer 11 and the first portion 20a after the first operation is different from the second electrical resistance between the first magnetic layer 11 and the first portion 20a after the second operation. The absolute value of the difference between the first electrical resistance and the second electrical resistance is greater than the absolute value of the difference between the third electrical resistance between the first magnetic layer 11 and the first portion 20a after the third operation and the fourth electrical resistance between the first magnetic layer 11 and the first portion 20a after the fourth operation.

Thus, the memory cell includes the first magnetic layer 11, the first nonmagnetic layer 11n, and the second magnetic layer 12. Then, the first operation causes the memory cell MC to be in a first memory state. The second operation causes the memory cell MC to be in a second memory state. A memory state of the memory cell substantially does not change between before and after the third operation, and substantially does not change between before and after the fourth operation.

In the magnetic memory device 110 according to the embodiment as well, a portion of the conductive layer 20 includes boron.

For example, the third portion 20c includes a first region 21 and a second region 22. The second region 22 is provided between the first region 21 and the second magnetic layer 12. For example, the second region 22 physically contacts the second magnetic layer 12. The second region 22 includes a first metal and boron. The first region 21 and the second region 22 are non-magnetic, for example.

In the example, the first region 21 extends along the second direction (e.g., the X-axis direction) between the first portion 20a and the second portion 20b. The second region 22 extends along the second direction between the first portion 20a and the second portion 20b. As described below, the second region 22 may be provided locally at a portion including a region overlapping the first stacked body SB1 in the Z-axis direction.

The first metal includes at least one selected from the group consisting of Ta, W, Re, Os, Ir, Pt, Au, Cu, Ag, and Pd. Thereby, for example, the spin Hall effect is obtained effectively.

The second region 22 includes boron and at least one selected from the group consisting of Ta, W, Re, Os, Ir, Pt, Au, Cu, Ag, and Pd. The second region 22 may include, for example, at least one selected from the group consisting of TaB, WB, ReB, OsB, IrB, PtB, AuB, CuB, AgB, and PdB. The second region 22 may include hafnium and the first metal. For example, the second region 22 may include hafnium and at least one selected from the group consisting of Ta, W, Re, Os, Ir, Pt, Au, Cu, Ag, and Pd.

On the other hand, the first region 21 does not include boron. Or, the first region 21 includes boron; and a first concentration of boron in the first region is lower than a second concentration of boron in the second region 22.

It was found that the current (the write current) of the write operation can be reduced by providing such a first region 21 and such a second region 22 in the conductive layer 20. As described below, it was also found that it is favorable for a thickness t2 of the second region 22 (referring to FIG. 1) to be not less than 1 nanometer (nm) and not more than 7 nm. As described below, it is more favorable for the thickness t2 of the second region 22 to be not less than 3 nm and not more than 5 nm.

Experimental results relating to the magnetic memory device will now be described.

Figure 2:
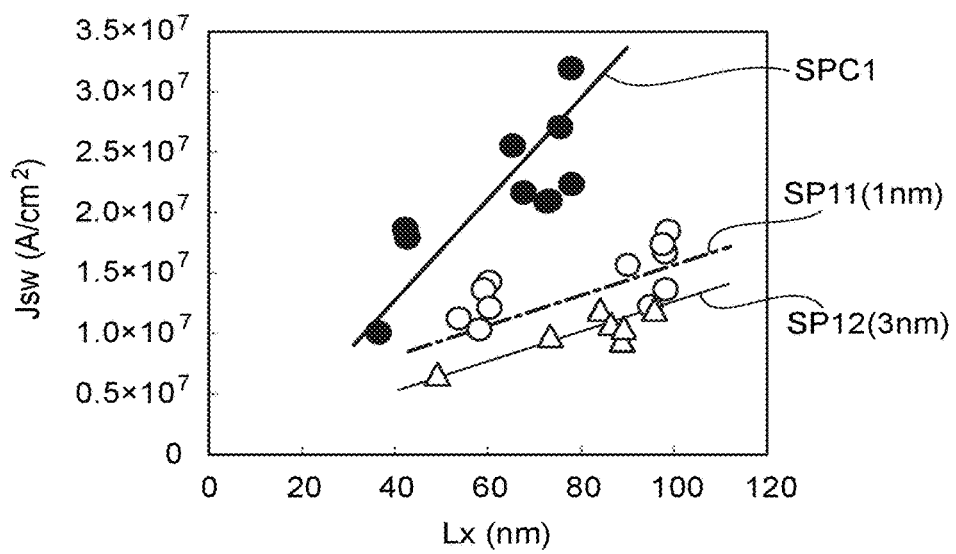
FIG. 2 is a graph illustrating a characteristic of the magnetic memory device.

FIG. 2 is a graph illustrating a characteristic of the magnetic memory device.

The characteristic is shown in FIG. 2 for a first sample SP11, a second sample SP12, and a reference sample SPC1. In the first sample SP11 and the second sample SP12, the first region 21 and the second region 22 are provided in the conductive layer 20. The first region 21 is a Ta layer. The second region 22 is TaB. The concentration (the composition ratio) of B in the second region 22 is 50 atomic percent (50 atm %). In the first sample SP11, the thickness t2 of the second region 22 (referring to FIG. 1) is 1 nm. The thickness t2 of the second region 22 is the thickness (the length) along the first direction (the Z-axis direction) of the second region 22. In the second sample SP12, the thickness t2 of the second region 22 is 3 nm. In the first sample SP11 and the second sample SP12, a thickness t1 of the first region 21 is 10 nm. On the other hand, the second region 22 is not provided in the reference sample SPC1. In the reference sample SPC1, a Ta layer having a thickness of 10 nm is provided as the conductive layer 20. The first metal is Ta in these samples.

In each of the samples recited above, the conductive layer 20 recited above is provided on a substrate (a silicon substrate having a thermal oxide film). The substrate includes a silicon substrate, and a thermal oxide film provided on the silicon substrate. An FeB layer is provided as the second magnetic layer 12 on the conductive layer 20. The concentration of B in the FeB layer is 20 atm %. A thickness tm2 of the second magnetic layer 12 (the FeB layer) (referring to FIG. 1) is 1.9 nm. A MgO layer (having a thickness of 1.6 nm) is provided as the first nonmagnetic layer 11n on the second magnetic layer 12. A stacked film of IrMn/CoFe/Ru/CoFeB is provided as the first magnetic layer 11 on the first nonmagnetic layer 11n. The CoFe layer is provided between the IrMn-layer and the MgO layer. The Ru layer is provided between the CoFe layer and the MgO layer. The CoFeB layer is provided between the Ru layer and the MgO layer.

The length in the X-axis direction of the first stacked body SB1 is modified in the samples recited above. The length in the X-axis direction of the first stacked body SB1 substantially corresponds to the length Lx along the second direction of the first magnetic layer 11. The length Lx corresponds to the length of the short side of the first stacked body SB1. The length along the second direction of the second magnetic layer 12 is not less than 1 times and not more than 1.1 times the length along the second direction of the first magnetic layer 11. In the example, the ratio of the length Ly to the length Lx is about 3.

The horizontal axis of FIG. 2 is the length Lx (nm). The vertical axis is a switching current density Jsw (A/cm$^2$). The switching current density Jsw is the current density relating to the write current.

It can be seen from FIG. 2 that the switching current density Jsw of the first sample SP11 and the second sample SP12 is smaller than the switching current density Jsw of the reference sample SPC1. Thus, the write current can be reduced by providing the second region 22 including boron.

As shown in FIG. 2, the switching current density Jsw of the second sample SP12 (having the second thickness t2 of 3 nm) is smaller than the switching current density Jsw of the first sample SP11 (having the second thickness t2 of 1 nm).

Experimental results of various characteristics relating to the second region 22 including boron will now be described.

Figure 3:
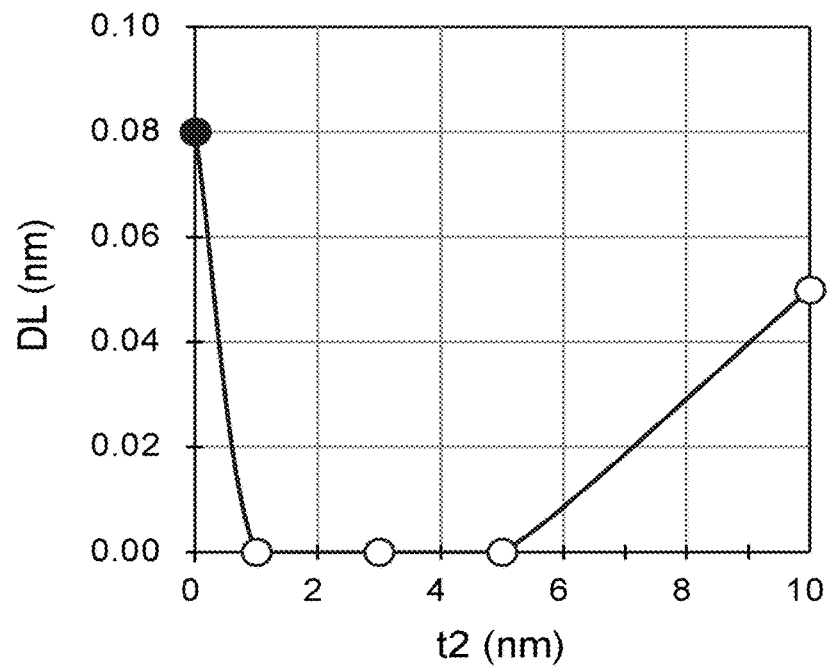
FIG. 3 is a graph illustrating a characteristic of the magnetic memory device.

FIG. 3 is a graph illustrating a characteristic of the magnetic memory device.

FIG. 3 shows the relationship between a thickness DL of a magnetic dead layer and the thickness t2 of the second region 22. In FIG. 3, the samples have a stacked structure of "Ta/MgO/FeB/TaB/Ta." The Ta layer (the first region 21) is provided on a silicon substrate having a thermal oxide film. The thickness of the Ta layer is 10 nm. The TaB layer (the second region 22) is provided on the Ta layer. The concentration of B in the TaB layer is 50 atm %. The FeB layer (the second magnetic layer 12) is provided on the TaB layer. The concentration of B in the FeB layer is 20 atm %. The thickness of the FeB layer is 1.5 nm to 3.0 nm. The MgO layer (the first nonmagnetic layer 11n) is provided on the FeB layer. The thickness of the MgO layer is 1.6 nm. Another Ta layer is provided on the MgO layer. The thickness of the Ta layer is 3 nm. In the experiment, the thickness t2 of the second region 22 is modified in the range of 1 nm to 10 nm. The second region 22 is not provided in the reference sample. The reference sample has a stacked structure of "Ta/MgO/FeB/Ta."

The thickness DL of the magnetic dead layer is determined by a vibrating sample magnetometer (VSM). As described above, it is possible to estimate the magnetic dead layer by measuring the magnetizations of the samples including the FeB layers having different thicknesses and by verifying the linear relation between the magnetization amount and the thickness of the FeB layer. The thickness DL of the magnetic dead layer may be determined by a magneto-optic (Kerr) effect measurement. A magnetization is not generated in the magnetic dead layer.

The horizontal axis of FIG. 3 is the thickness t2 (nm) of the second region 22. The vertical axis is the thickness DL (nm) of the magnetic dead layer. In FIG. 3, the thickness DL of the magnetic dead layer of the reference sample in which the second region 22 is not provided is displayed where the thickness t2 is 0.

As shown in FIG. 3, the thickness DL of the magnetic dead layer of the reference sample in which the second region 22 is not provided (having the thickness t2 of 0 nm) is 0.08 nm and is large. Conversely, the thickness DL of the magnetic dead layer is substantially 0 when the thickness t2 of the second region 22 is not less than 1 nm and not more than 5 nm. The thickness DL of the magnetic dead layer is about 0.05 nm when the thickness t2 is 10 nm.

From the results of FIG. 3, it is favorable for the thickness t2 of the second region 22 to be not less than 1 nm and not more than 5 nm. In such a case, for example, the magnetic dead layer substantially does not occur.

It is considered that the magnetic dead layer substantially does not occur when the thickness t2 of the second region 22 is not less than 1 nm and not more than 5 nm because, for example, the wettability of the interface is improved because both the FeB layer (the second magnetic layer 12) and the TaB layer (the second region 22) include boron. For example, the TaB layer is a refractory material. Therefore, it is considered that mutual diffusion of the elements does not occur easily between the TaB layer and the FeB layer. Thereby, it is considered that the magnetic dead layer substantially does not occur. Also, for example, the flatness of the TaB layer is good. Therefore, it is considered that the magnetic dead layer substantially does not occur.

It is considered that the flatness of the surface of the second region 22 degrades in the case where the thickness t2 of the second region 22 is excessively thick. When the thickness t2 of the second region 22 is thick such as 10 nm, for example, it is considered that there is a relationship between the degradation of the flatness and the thickness DL of the magnetic dead layer increasing.

Figure 4:
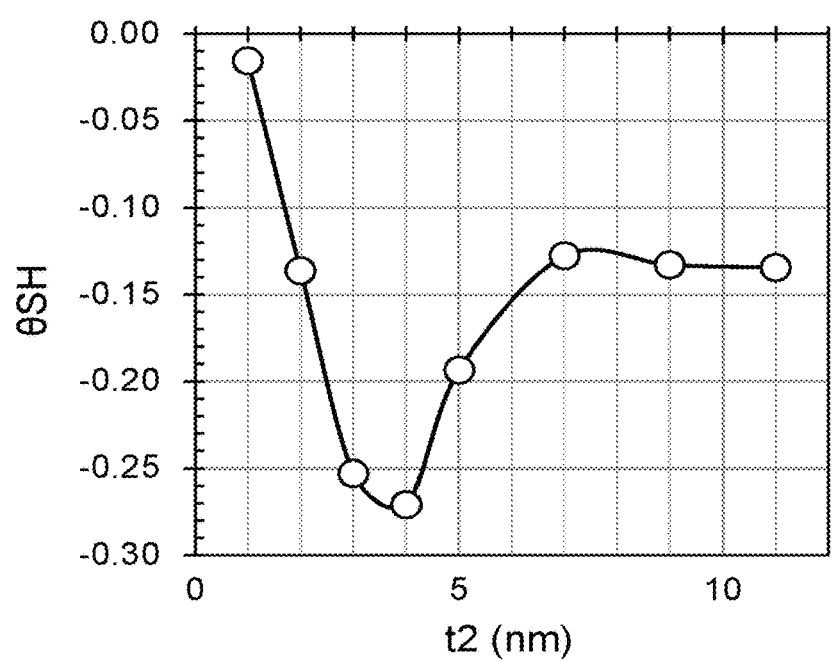
FIG. 4 is a graph illustrating a characteristic of the magnetic memory device.

For example, FIG. 4 is a graph illustrating a characteristic of the magnetic memory device.

FIG. 4 shows the relationship between a spin Hall angle θSH and the thickness t2 of the second region 22. In FIG. 4, the samples have a configuration of "TaB/CoFeB/silicon substrate with thermal oxide film." In the experiment, the thickness t2 of the second region 22 is modified in a range of 1 nm to 11 nm. The spin Hall angle θSH is derived by a FMR measurement for multiple resonance frequencies.

As shown in FIG. 4, the absolute value of the spin Hall angle θSH is large when the thickness t2 of the second region 22 is in the range of not less than 3 nm and not more than 7 nm. It is considered that the relationship between the spin diffusion length and the thickness t2 of the second region 22 affects the spin Hall angle.

When the absolute value of the spin Hall angle θSH is large, for example, it is considered that the spin-orbit coupling acts efficiently between the conductive layer 20 and the second magnetic layer 12. When the absolute value of the spin Hall angle θSH is large, for example, it is considered that the write current becomes small.

As recited above, for example, the magnetic dead layer can be reduced when the thickness t2 of the second region 22 is in the appropriate range. For example, the absolute value of the spin Hall angle θSH can be increased when the thickness t2 of the second region 22 is in the appropriate range.

It is considered that the decrease of the switching current density Jsw described in reference to FIG. 2 has a relationship with at least one of the magnetic dead layer or the spin Hall angle θSH.

As described above, from the perspective of the magnetic dead layer, the appropriate range of the thickness t2 of the second region 22 is not less than 1 nm and not more than 5 nm. From the perspective of the spin Hall angle θSH, the appropriate range of the thickness t2 of the second region 22 is not less than 3 nm and not more than 7 nm. Considering both, it is more favorable for the thickness t2 of the second region 22 to be not less than 3 nm and not more than 5 nm.

Figure 5:
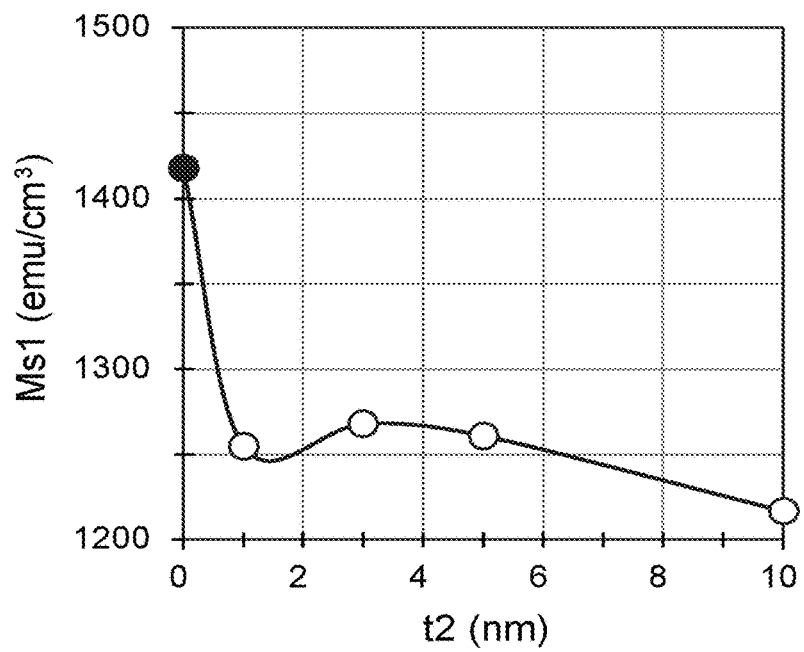
FIG. 5 is a graph illustrating a characteristic of the magnetic memory device.

FIG. 5 is a graph illustrating a characteristic of the magnetic memory device.

FIG. 5 shows evaluation results of the saturation magnetization for the samples described in reference to FIG. 3. The samples have the stacked structure of "Ta/MgO/FeB/TaB/Ta." The reference sample has a stacked structure of "Ta/MgO/FeB/Ta." The horizontal axis of FIG. 5 is the thickness t2 (nm) of the second region 22. The vertical axis is a saturation magnetization Ms1 (emu/cm$^3$) of the FeB layer (the second magnetic layer 12). 1 emu corresponds to $10^{-3}$ A·m$^2$. When the saturation magnetization Ms1 is small, the magnetization is reversed easily; and the write current is small.

As shown in FIG. 5, the saturation magnetization Ms1 is large in the reference sample in which the second region 22 is not provided (having a thickness t2 of 0 nm). Conversely, the saturation magnetization Ms1 becomes small when the thickness t2 of the second region 22 is 1 nm or more.

In the reference sample in which the TaB layer (the second region 22) is not provided, the diffusion of B occurs from the FeB layer to the Ta layer. Thereby, it is considered that the concentration of B in the FeB layer is low. Therefore, in the reference sample, it is considered that the saturation magnetization Ms1 is large. Conversely, in the case where the TaB layer (the second region 22) is provided, it is considered that the B diffusion from the FeB layer to the TaB layer is suppressed. Thereby, it is considered that the saturation magnetization Ms1 becomes small.

Figure 6:
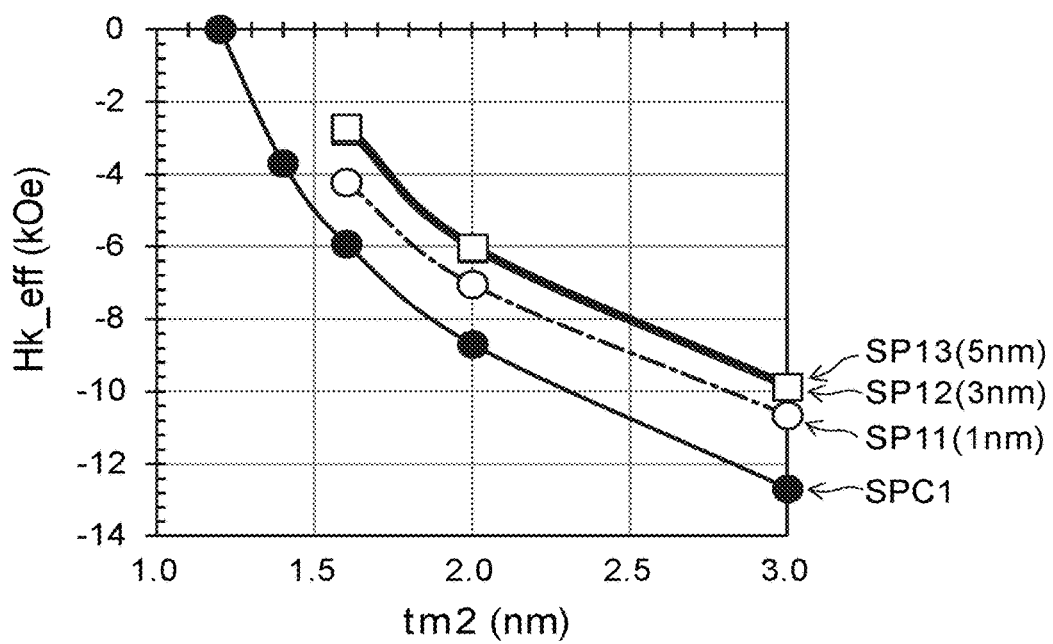
FIG. 6 is a graph illustrating a characteristic of the magnetic memory device.

FIG. 6 is a graph illustrating a characteristic of the magnetic memory device.

FIG. 6 shows evaluation results of an effective perpendicular anisotropic magnetic field Hk_eff for the samples described in reference to FIG. 3. The first sample SP11, the second sample SP12, and a third sample SP13 have the stacked structure of "Ta/MgO/FeB/TaB/Ta." In the first sample SP11, the thickness t2 of the TaB layer (the second region 22) is 1 nm. In the second sample SP12, the thickness t2 of the TaB layer (the second region 22) is 3 nm. In the third sample SP13, the thickness t2 of the TaB layer (the second region 22) is 5 nm. The reference sample SPC1 has a stacked structure of "Ta/MgO/FeB/Ta." The horizontal axis of FIG. 6 is the thickness tm2 (nm) of the FeB layer (the second magnetic layer 12). The vertical axis is a perpendicular anisotropic magnetic field Hk_eff (kOe) of the FeB layer (the second magnetic layer 12). 1 Oe corresponds to 80A/m. A negative perpendicular anisotropic magnetic field Hk_eff corresponds to the FeB layer being an in-plane magnetization film.

As shown in FIG. 6, the absolute values of the perpendicular anisotropic magnetic field Hk_eff obtained in the first to third samples SP11 to SP13 are smaller than that of the reference sample SPC1. The perpendicular anisotropy is higher for the first to third samples SP11 to SP13 than for the reference sample SPC1.

Substantially the same perpendicular anisotropic magnetic field Hk_eff is obtained when the thickness t2 of the TaB layer (the second region 22) is 3 nm and 5 nm. The improvement of the perpendicular anisotropic magnetic field Hk_eff is substantially saturated when the thickness t2 is 3 nm to 5 nm.

As described above in reference to FIG. 5, the saturation magnetization Ms1 of the FeB layer decreases due to the TaB layer. Thereby, the demagnetizing field component decreases. As described in reference to FIG. 3, the thickness DL of the magnetic dead layer decreases due to the TaB layer. In particular, the thickness DL is small when the thickness t2 of the TaB layer (the second region 22) is 1 nm to 5 nm. It is considered that good flatness is obtained at the interface when the thickness t2 of the TaB layer (the second region 22) is 1 nm to 5 nm. For example, it is considered that the interface magnetic anisotropy is obtained due to the good flatness and the decrease of the thickness DL. It is considered that the phenomenon of the absolute value of the perpendicular anisotropic magnetic field Hk_eff decreasing due to the TaB layer is due to the interface magnetic anisotropy recited above and the decrease of the demagnetizing field component recited above.

For example, an operation having a precessional switching mode is performed in the case where, for example, the first magnetic layer 11 and the second magnetic layer 12 are substantially in-plane magnetization films and the direction of the current flowing in the conductive layer 20 and the direction of the magnetization of the in-plane magnetization film cross. In this mode, the magnetization reversal of the memory layer accompanies precession from the in-plane magnetization direction toward the perpendicular direction. The magnetization reversal is easier in this mode when the absolute value of the perpendicular anisotropic magnetic field Hk_eff is small. By reducing the absolute value of the perpendicular anisotropic magnetic field Hk_eff, the write current can be small.

Figure 7:
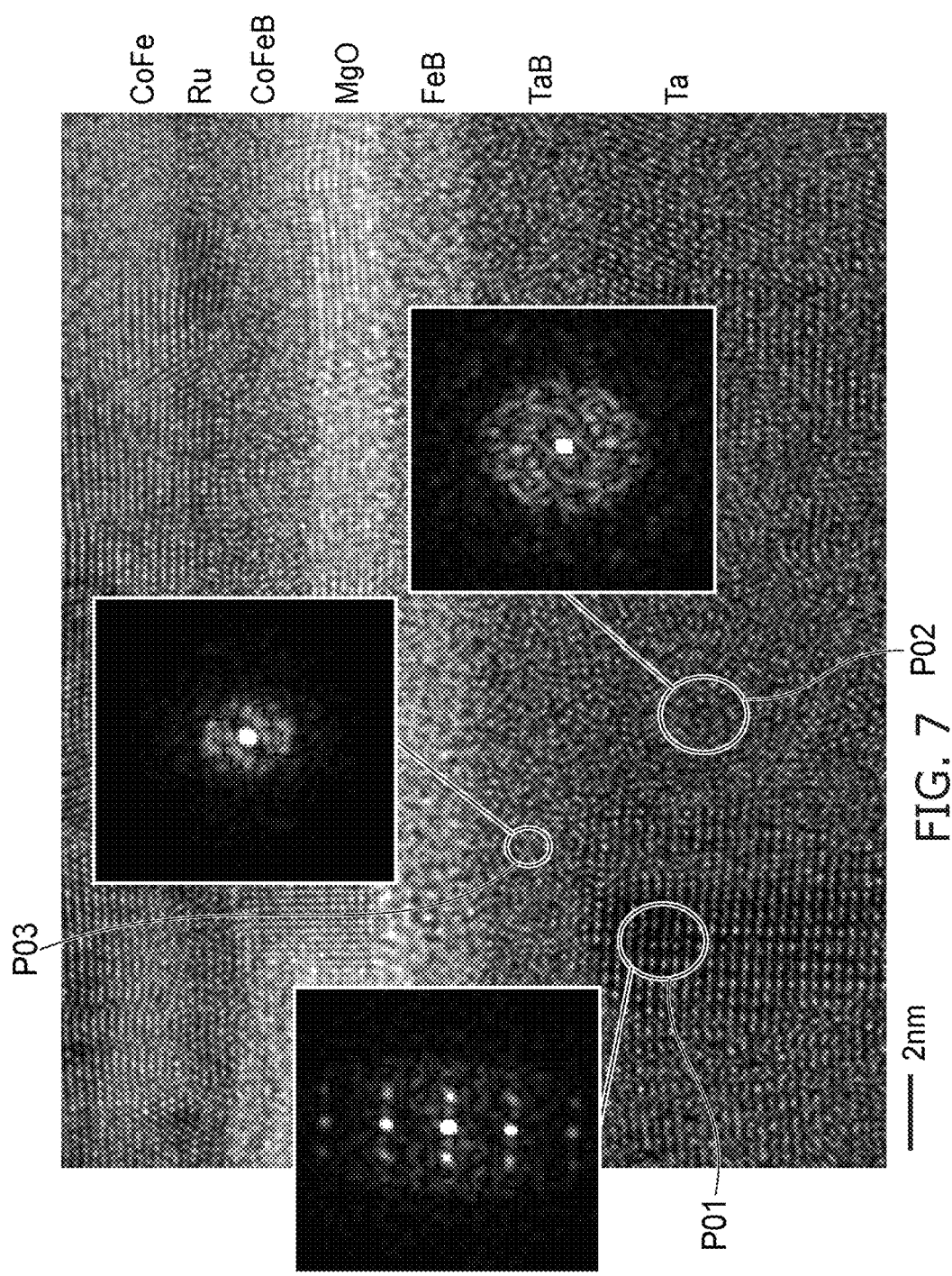
FIG. 7 is a photograph illustrating a TEM image and FFT analysis images of a portion of the magnetic memory device.

FIG. 7 is a photograph illustrating a TEM image and FFT analysis images of a portion of the magnetic memory device.

The sample of the image shown in FIG. 7 has a stacked structure of "IrMn/Co Fe/Ru/CoFeB/MgO/FeB/TaB/Ta." The thickness t2 of the TaB layer (the second region 22) is 3 nm. In FIG. 7, the IrMn-layer is outside the range of the observation.

The Ta layer (the first region 21) includes a portion (a first position P01) where a lattice pattern is observed, and a portion (a second position P02) where the lattice pattern is not observed. It can be seen in the FFT analysis that the portion (the first position P01) where the lattice pattern is observed has a tetragonal crystal structure. From the plane spacing in this portion, this suggests that the β-phase is formed.

At the portion (the second position P02) where the lattice pattern is not observed, there is a possibility that a lattice pattern may be observed according to the TEM observation direction. Accordingly, it cannot be concluded from the halo pattern of the FFT analysis that this portion is amorphous. Overall, this suggests that the Ta layer (the first region 21) includes a polycrystal β-phase.

On the other hand, a lattice pattern is not observed in a wide area of the TaB layer (the second region 22, e.g., a third position P03, etc.). The FFT analysis image has a halo pattern in the TaB layer. Therefore, this suggests that the TaB layer (the second region 22) is not affected by the crystallinity of the Ta layer and is amorphous.

Figure 8:
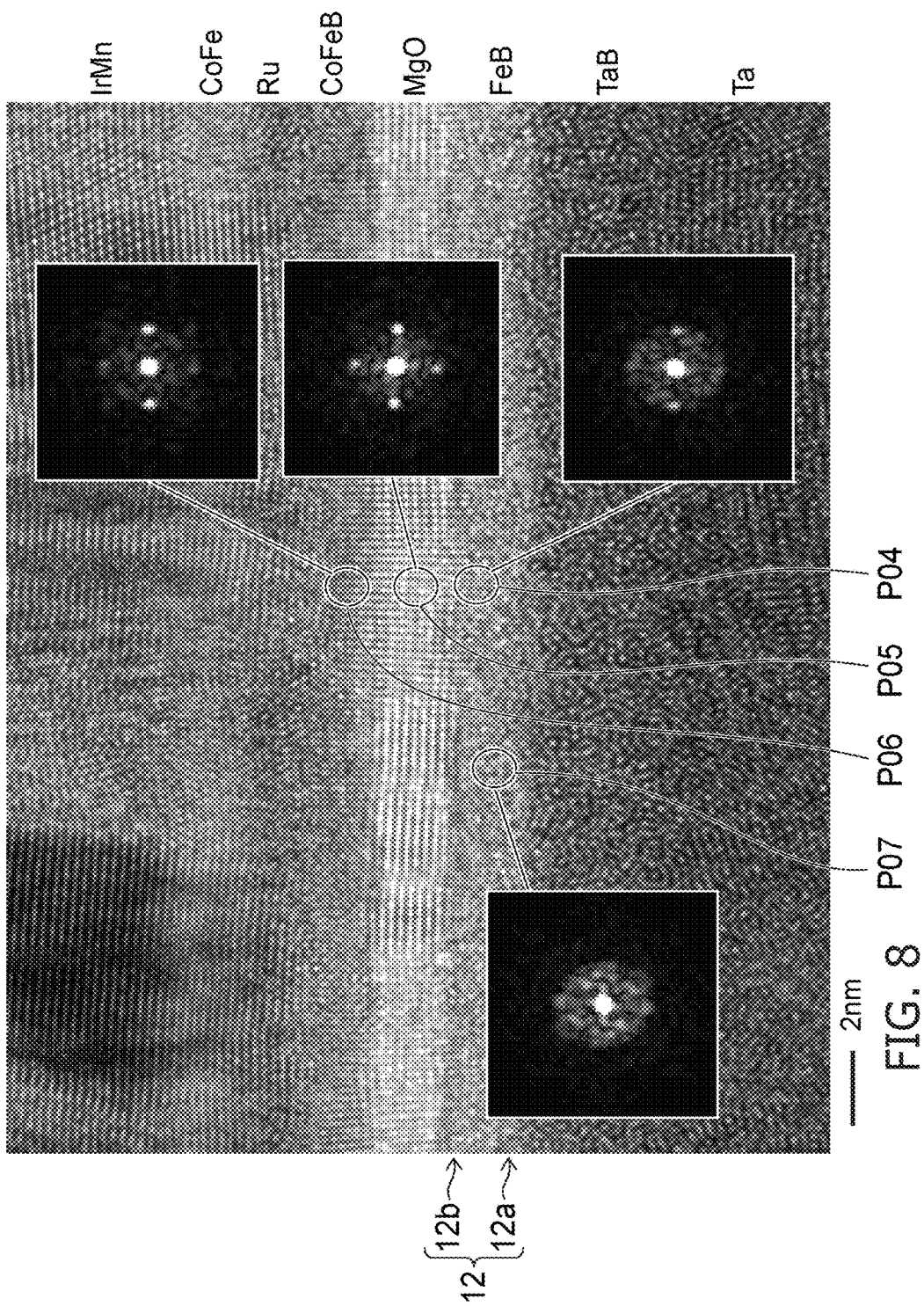
FIG. 8 is a photograph illustrating a TEM image and FFT analysis images of a portion of the magnetic memory device.

FIG. 8 is a photograph illustrating a TEM image and FFT analysis images of a portion of the magnetic memory device.

Similarly to the sample of FIG. 7, the sample of the image shown in FIG. 8 has the stacked structure of "IrMn/CoFe/Ru/CoFeB/MgO/FeB/TaB/Ta." The thickness t2 of the TaB layer (the second region 22) is 3 nm.

A lattice pattern is not observed in the lower portion (a first magnetic region 12a) of the FeB layer (the second magnetic layer 12, i.e., the memory layer). The FFT analysis image has a halo pattern in the lower portion of the FeB layer. Therefore, this suggests that the lower portion of the FeB layer is amorphous.

A crystallization region is observed in the upper portion (a second magnetic region 12b) of the FeB layer at the interface with the MgO layer. The thickness of the crystallization region is about 1 atomic layer thick to 5 atomic layers thick (not less than 0.2 nm and not more than 1.0 nm). The plane spacing of the FFT analysis image of the crystallization region is nearly the lattice spacing of the MgO layer. This suggests that the crystallization region grows from the interface with the MgO layer.

Thus, the FeB layer (the second magnetic layer 12) includes the first magnetic region 12a (including, for example, a seventh position P07) and the second magnetic region 12b (including, for example, a fourth position P04).

The second magnetic region 12b is positioned between the first magnetic region 12a and the first nonmagnetic layer 11n. At least a portion of the first magnetic region 12a is amorphous. At least a portion of the second magnetic region 12b is crystalline. The thickness of the second magnetic region 12b is, for example, not less than 0.2 nm and not more than 1.0 nm. For example, the crystallinity of the second magnetic region 12b is higher than the crystallinity of the first magnetic region 12a.

Good flatness is observed in the MgO layer (the first nonmagnetic layer 11n, i.e., the fifth position P05). It can be seen that the MgO layer has the (001) orientation. It is considered that the self-orientation of the MgO layer is high because the FeB layer is amorphous.

A crystallized region is observed on the side (a sixth position P06) of the CoFeB layer (a portion of the first magnetic layer 11) at the interface with the MgO layer. From the plane spacing obtained by the FFT analysis image of this region, it is considered that this region grows from the MgO layer.

Lattice patterns are observed when the observation directions at both interfaces on and under the MgO layer match the crystal growth surface of the MgO layer. It is considered that similar lattice patterns are observed in the other observation directions as well. Thereby, a high MR ratio (e.g., a TMR ratio) is obtained.

The results of SMR (spin-Hall magnetoresistance) analysis of the characteristics of the stacked structure of the second magnetic layer 12 and the conductive layer 20 will now be described. One of the samples (a first SMR sample) of the SMR analysis has a stacked structure of "CoFeB/TaB." The TaB layer of this sample is amorphous. Another sample (a second SMR sample) has a stacked structure of "CoFeB/Ta." The Ta layer of this sample is β-Ta. The CoFeB layer corresponds to the second magnetic layer 12. The TaB layer or the Ta layer corresponds to the conductive layer 20. In the SMR analysis, the spin Hall angle θSH, a resistivity ρ, and a spin diffusion length λspin of the conductive layer 20 are evaluated. In the SMR analysis, it is assumed that the characteristics of the conductive layer 20 are unique regardless of the thickness.

In the results of the SMR analysis, the spin Hall angle θSH of the first SMR sample (the TaB layer) is −0.18. On the other hand, the spin Hall angle θSH of the second SMR sample (the Ta layer) is −0.09. Thus, a large spin Hall angle θSH is obtained for the material including B. Although the value of the spin Hall angle θSH of the first SMR sample (the TaB layer) strictly does not match the value of the spin Hall angle θSH described in reference to FIG. 4, it is possible to compare the relative relationship between the first SMR sample and the second SMR sample.

This suggests that a large spin Hall angle θSH is obtained even if the conductive layer 20 is amorphized. The range of the selection of the material of the conductive layer 20 widens. For example, μ-Ta or β-W for which a large spin Hall angle θSH is reported has a polycrystalline structure. In the polycrystalline structure, the characteristics of the MTJ element fluctuate easily due to the roughness or the grain boundaries caused by, for example, the crystallinity. In the polycrystalline structure, for example, negative effects on the reliability occur easily. In the conductive layer 20 that includes boron, an amorphous region is obtained; the fluctuation of the characteristics can be suppressed; and good reliability is obtained.

In the results of the SMR analysis, the spin diffusion length λspin of the first SMR sample (the TaB layer) is 1.06 nm. On the other hand, the spin diffusion length λspin of the second SMR sample (the Ta layer) is 0.51 nm. A long spin diffusion length λspin is obtained for the material including B. In the case where the spin diffusion length λspin is long, for example, the spin does not diffuse easily even for a long distance. For example, the thickness of the conductive layer 20 can be increased for a long spin diffusion length λspin.

For example, by using a material having a large λspin such as amorphous TaB, the thickness of the conductive layer 20 can be increased; and, for example, the resistance of the conductive layer 20 can be reduced.

On the other hand, in the first SMR sample (the TaB layer), the resistivity ρ of the TaB layer is 215.2 μΩcm; and the resistivity ρ of the CoFeB layer is 103.3μΩcm. In the second SMR sample (the Ta layer), the resistivity ρ of the Ta layer is 185.5μΩcm; and the resistivity ρ of the CoFeB layer is 52.4 μΩcm.

The resistivity ρ (103.3μΩcm) of the CoFeB layer of the first SMR sample is markedly higher than the resistivity ρ (52.4 μΩcm) of the CoFeB layer of the second SMR sample. It is considered that this is because the concentration of B inside the CoFeB layer of the first SMR sample is higher than the concentration of B inside the CoFeB layer of the second SMR sample.

In the first SMR sample, the ratio of a resistivity ρ1 of the TaB layer to a resistivity ρ2 of the CoFeB layer (a resistivity ratio ρ1/ρ2) is 2.08. In the second SMR sample, the ratio a resistivity ρ3 of the Ta layer to the resistivity ρ2 of the CoFeB layer (a resistivity ratio ρ3/ρ2) is 3.54.

When the current flows in the conductive layer 20, a portion of the current flows also in the second magnetic layer 12 according to the resistivity ratio. In the second SMR sample, the resistivity ratio ρ3/ρ2 is high; therefore, the proportion of the current flowing in the second magnetic layer 12 increases; and the proportion of the current flowing in the conductive layer 20 decreases. Therefore, the current (the current density) necessary for the magnetization reversal is large. Conversely, in the first SMR sample, the resistivity ratio ρ1/ρ2 is low; therefore, the proportion of the current flowing in the second magnetic layer 12 is low; and the proportion of the current flowing in the conductive layer 20 increases. Therefore, the current (the current density) necessary for the magnetization reversal can be small.

In the embodiment as recited above, the switching current density Jsw can be reduced by the second region 22 including boron (referring to FIG. 2). For example, it is considered that this is because the thickness DL of the magnetic dead layer can be reduced. From the perspective of the decrease of the thickness DL, it is favorable for the thickness t2 of the second region 22 to be not less than 1 nm and not more than 5 nm. Further, it is considered that the decrease of the switching current density Jsw due to the second region 22 also is caused by, for example, the decrease of the saturation magnetization Ms1. It is considered that the decrease of the switching current density Jsw due to the second region 22 also is caused by, for example, the decrease of the absolute value of the perpendicular anisotropic magnetic field Hk_eff. It is considered that the decrease of the switching current density Jsw due to the second region 22 also is caused by, for example, the increase of the spin Hall angle θSH.

Experimental results relating to the concentration (the composition ratio) of boron in the second region 22 will now be described.

Figure 9A:
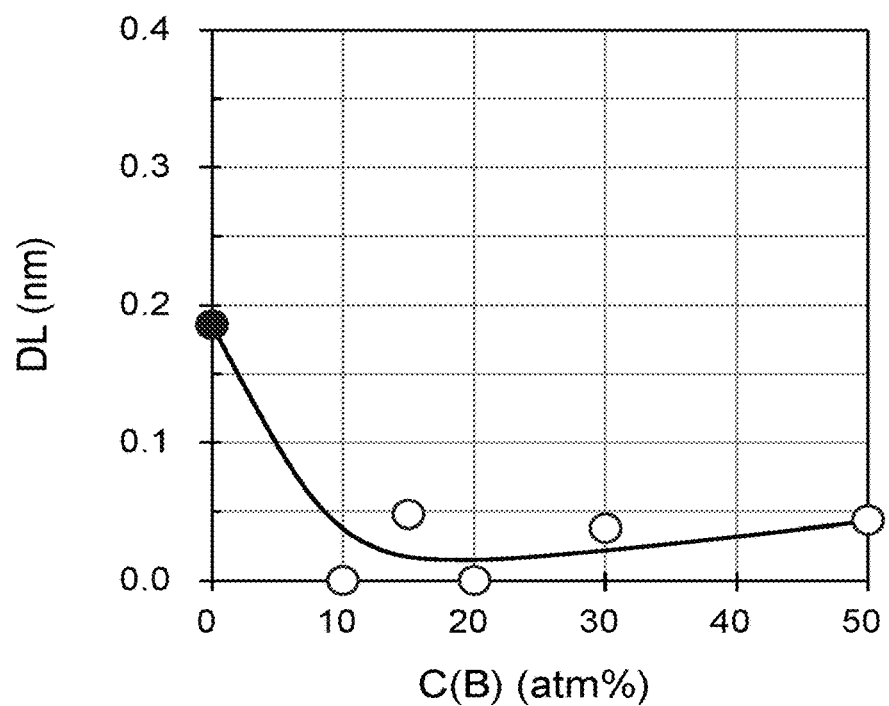
FIG. 9A and FIG. 9B are graphs illustrating characteristics of the magnetic memory device.
Figure 9B:
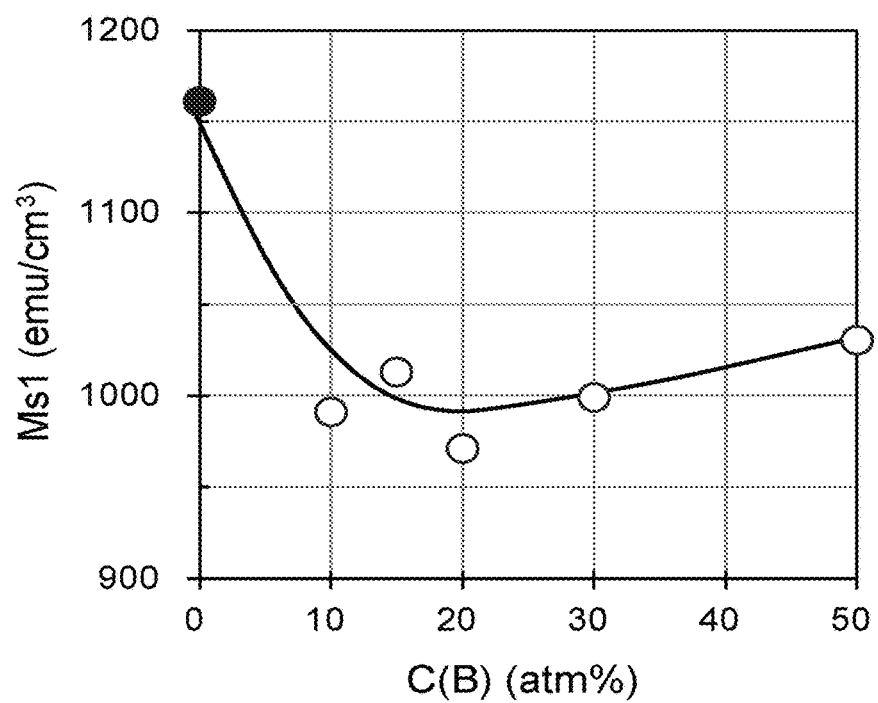

FIG. 9A and FIG. 9B are graphs illustrating characteristics of the magnetic memory device.

FIG. 9A shows the relationship between the concentration (the composition ratio) of boron in the second region 22 and the thickness DL of the magnetic dead layer. FIG. 9B shows the relationship between the saturation magnetization Ms1 and the concentration (the composition ratio) of boron in the second region 22. The samples have the stacked structure of "Ta/MgO/FeB/TaB/Ta" described in reference to FIG. 3. In the samples, the concentration (the second concentration) of boron in the second region 22 is modified. The thickness t2 of the second region 22 is 3 nm. Otherwise, the configurations of the samples are similar to the configurations of the samples described in reference to FIG. 3. In these figures, the horizontal axis is the concentration (the second concentration C(B), i.e., the composition ratio) of boron in the second region 22 (atomic percent (atm %)). In the case where the second concentration C(B) is 0%, the second region 22 is not provided. In this case, a Ta layer having a thickness of 10 nm is provided.

As shown in FIG. 9A, the thickness DL of the magnetic dead layer decreases when the second concentration C(B) is 10 atm % or more. The thickness DL is substantially constant when the second concentration C(B) is 10 atm % or more.

As shown in FIG. 9B, the saturation magnetization Ms1 is small when the second concentration C(B) is not less than 10 atm % and not more than 30 atm %.

Figure 10:
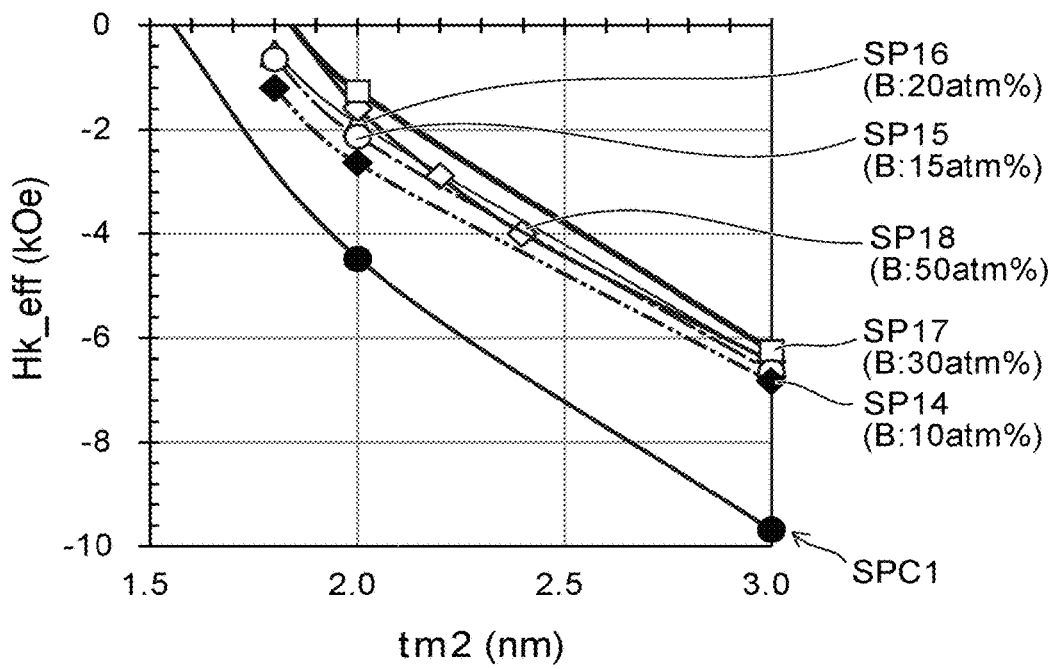
FIG. 10 is a graph illustrating a characteristic of the magnetic memory device.

FIG. 10 is a graph illustrating a characteristic of the magnetic memory device.

FIG. 10 shows the perpendicular anisotropic magnetic field Hk_eff for different boron concentrations of the second region 22. Fourth to eighth samples SP14 to SP18 have the stacked structure of "Ta/MgO/FeB/TaB/Ta." In the fourth to eighth samples SP14 to SP18, the thickness of the second region 22 is 3 nm. In the fourth to eighth samples SP14 to SP18, the concentration (the second concentration) of boron in the second region 22 is respectively 10 atm %, 15 atm %, 20 atm %, 30 atm %, or 50 atm %. Otherwise, the configurations are similar to those of the samples described in reference to FIG. 3. The reference sample SPC1 shown in FIG. 10 has a configuration similar to that of the reference sample SPC1 shown in FIG. 3. The conditions for making the FeB layer for the reference sample SPC1 and the fourth to eighth samples SP14 to SP18 shown in FIG. 10 are different from those of the reference sample SPC1 and the samples shown in FIG. 3. The horizontal axis of FIG. 10 is the thickness tm2 (nm) of the FeB layer (the second magnetic layer 12). The vertical axis is the perpendicular anisotropic magnetic field Hk_eff (kOe) of the FeB layer (the second magnetic layer 12).

As shown in FIG. 10, perpendicular anisotropic magnetic fields Hk_eff that have absolute values that are smaller than that of the reference sample SPC1 are obtained for the fourth to eighth samples SP14 to SP18. The decrease of the absolute value of the perpendicular anisotropic magnetic field Hk_eff substantially has a peak when the second concentration of boron in the second region 22 is 30%. The absolute value of the perpendicular anisotropic magnetic field Hk_eff is greater when the second concentration of boron in the second region 22 is 50%.

From the results of FIG. 9A, FIG. 9B, and FIG. 10, it is favorable for the second concentration of boron in the second region 22 to be not less than 10 atm % and not more than 50 atm %. It is more favorable for the second concentration of boron in the second region 22 to be not less than 10 atm % and not more than 30 atm %. In such a case, for example, the saturation magnetization Ms1 is particularly small. In such a case, for example, the absolute value of the perpendicular anisotropic magnetic field Hk_eff is particularly small. In the embodiment, it is preferable that the second concentration C(B) is not less than 5 atm %. It is further preferable that the second concentration C(B) is not less than 10 atm %. It is preferable that the second concentration C(B) is not more than atm %. It is further preferable that the second concentration C(B) is not more than 50 atm %.

On the other hand, in the embodiment, boron may not be included in the second magnetic layer 12. Or, in the embodiment, the second magnetic layer 12 may include boron. In such a case, the concentration of boron in the second magnetic layer 12 is lower than the concentration (the second concentration) of boron in the second region 22. For example, in the case where the concentration of boron in the second magnetic layer 12 is higher than the second concentration, the boron that is included in the second magnetic layer 12 moves easily into the second region 22; and the characteristics may fluctuate due to the boron included in the second magnetic layer 12. In the case where the concentration of boron in the second magnetic layer 12 is lower than the second concentration, the concentration of boron in the second magnetic layer 12 stabilizes; and it is easier to obtain the desired characteristics. The concentration of boron in the second magnetic layer 12 is, for example, 30 atomic percent (atm %) or less.

In the embodiment, the second magnetic layer 12 includes a first element including at least one selected from the group consisting of Co, Fe, and Ni. In the embodiment, the second magnetic layer 12 may include a second element including at least one selected from the group consisting of C, N, O, Si, and P. For example, the concentration of the second element in the second magnetic layer 12 is 30 atomic percent or less. The second magnetic layer 12 may further include boron.

For example, when analyzing the second magnetic layer 12, the second region 22, and the first region 21, the concentration (the second concentration) of boron in the second region 22 is higher than the concentration of boron in the second magnetic layer 12. The concentration (the second concentration) of boron in the second region 22 is higher than the concentration (the first concentration) of boron in the first region 21. A concentration distribution of boron may exist inside the second region 22 and the first region 21. For example, the concentration of boron may decrease gradually from the second region 22 toward the first region 21.

In the embodiment, for example, the first region 21 includes the first metal included in the second region 22. For example, the flatness is improved further by the same first metal element being included in the first region 21 and the second region 22. For example, the wettability of the first region 21 and the second region 22 improves further.

In the embodiment, at least a portion of the second region 22 is amorphous.

In the embodiment, the conductive layer 20 may include oxygen. For example, the second region 22 may include oxygen in addition to the first metal and boron. As described above, the first metal includes at least one selected from the group consisting of Ta, W, Re, Os, Ir, Pt, Au, Cu, Ag, and Pd.

The first region 21 may include the first metal. Or, the first region 21 may include a second metal. The second metal includes at least one selected from the group consisting of Ta, W, Re, Os, Ir, Pt, Au, Cu, Ag, and Pd and is different from the first metal. The first region 21 may include oxygen and at least one of the first metal or the second metal.

In the case where the second region 22 includes oxygen, for example, the spin Hall angle θSH that has a large absolute value can be obtained. The concentration of oxygen in the second region 22 is adjusted to an appropriate value. For example, the spin Hall angle θSH that has a large absolute value is obtained when the concentration of oxygen in the second region 22 is 5 atm % or more. For example, the increase of the resistivity of the second region 22 can be suppressed when the concentration of oxygen in the second region 22 is 15 atm % or less. For example, the concentration of oxygen in the second region 22 is not less than 5 atm % and not more than 15 atm %.

The second region 22 may include, for example, at least one selected from the group consisting of TaBO, WBO, ReBO, OsBO, IrBO, PtBO, AuBO, CuBO, AgBO, and PdBO. The second region 22 may include a composite including at least two selected from the group. The second region 22 may include, for example, at least one selected from the group consisting of TaWBO, TaReBO, TaOsBO, TaIrBO, TaPtBO, TaAuBO, TaCuBO, TaAgBO, TaPdBO, WReBO, WOsBO, WIrBO, WPtBO, WAuBO, WCuBO, WAgBO, WPdBO, ReOsBO, ReIrBO, RePtBO, ReAuBO, ReCuBO, ReAgBO, RePdBO, OsIrBO, OsPtBO, OsAuBO, OsCuBO, OsAgBO, OsPdBO, IrPtBO, PtAgBO, IrAuBO, IrCuBO, IrAgBO, IrPdBO, PtAuBO, PtCuBO, PtPdBO, AuCuBO, AuAgBO, AuPdBO, CuAgBO, CuPdBO, and AgPdBO.

Experimental results will now be described for the case where the first metal is W. The second metal is Ta in the following example.

A sample SP20 described below has a stacked structure of "Ta/MgO/FeB/WB/Ta." The Ta layer (the first region 21) is provided on a substrate (a silicon substrate having a thermal oxide film). The thickness of the Ta layer is 10 nm. The WB layer (the second region 22) is provided on the Ta layer. The concentration of B in the WB layer is 20 atm %. The FeB layer (the second magnetic layer 12) is provided on the WB layer. The concentration of B in the FeB layer is 20 atm %. The thickness of the FeB layer is 1.5 nm to 3.0 nm. The MgO layer (the first nonmagnetic layer 11n) is provided on the FeB layer. The thickness of the MgO layer is 1.6 nm. Another Ta layer is provided on the MgO layer. The thickness of the Ta layer is 3 nm. In the experiment, the thickness t2 of the second region 22 is modified in the range of 1 nm to 3 nm. The second region 22 that includes boron is not provided in the reference samples SPC1 and SPC2. The reference sample SPC1 has the stacked structure of "Ta/MgO/FeB/Ta." In the reference sample SPC2, a tungsten layer that has a thickness of 1 nm is provided between the second magnetic layer 12 and the first region 21 of Ta. The reference sample SPC2 has a stacked structure of "Ta/MgO/FeB/W/Ta."

Figure 11:
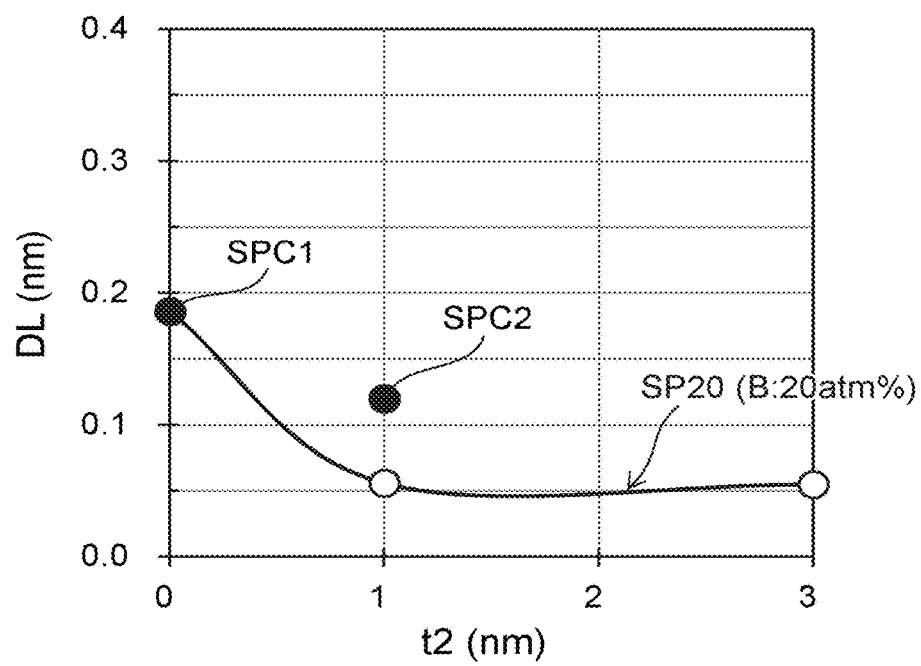
FIG. 11 is a graph illustrating a characteristic of the magnetic memory device.

FIG. 11 is a graph illustrating a characteristic of the magnetic memory device.

FIG. 11 shows the relationship between the thickness DL of the magnetic dead layer and the thickness t2 of the second region 22 in the sample SP20 and the reference samples SPC1 and SPC2. In FIG. 11, the horizontal axis is the thickness t2 (nm) of the second region 22. The vertical axis is the thickness DL (nm) of the magnetic dead layer. In FIG. 11, the thickness DL of the magnetic dead layer of the reference sample SPC1 is displayed at the position where the thickness t2 is 0 nm. In FIG. 11, the thickness DL of the magnetic dead layer of the reference sample SPC2 in which the W layer is provided is displayed at the position where the thickness t2 is 1 nm.

It can be seen from FIG. 11 that the thickness DL of the magnetic dead layer of the reference sample SPC1 is large. The thickness DL of the magnetic dead layer of the reference sample SPC2 is smaller than the thickness DL of the magnetic dead layer of the reference sample SPC1. The thickness DL of the magnetic dead layer of the sample SP20 including the second region 22 including boron is smaller than the thickness DL of the magnetic dead layer of the reference sample SPC2.

As shown in FIG. 11, the thickness DL of the magnetic dead layer is small when the thickness t2 of the second region 22 is 1 nm or more.

Figure 12:
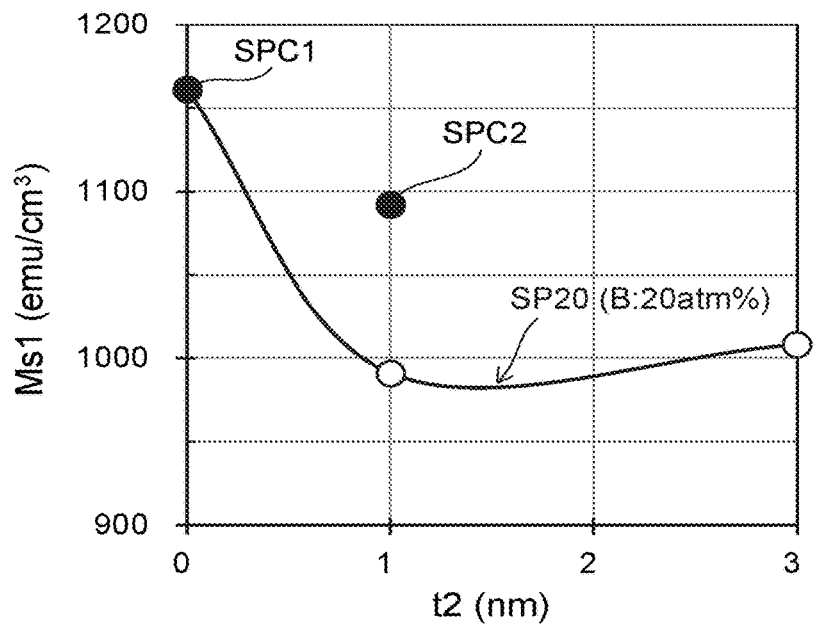
FIG. 12 is a graph illustrating a characteristic of the magnetic memory device.

FIG. 12 is a graph illustrating a characteristic of the magnetic memory device.

FIG. 12 shows the evaluation results of the saturation magnetization of the samples described in reference to FIG. 11. The sample SP20 has the stacked structure of "Ta/MgO/FeB/WB/Ta." The reference sample SPC1 has the stacked structure of "Ta/MgO/FeB/Ta." The reference sample SPC2 has the stacked structure of "Ta/MgO/FeB/W/Ta." In FIG. 12, the horizontal axis is the thickness t2 (nm) of the second region 22. The vertical axis is the saturation magnetization Ms1 (emu/cm$^3$) of the FeB layer (the second magnetic layer 12).

It can be seen from FIG. 12 that the saturation magnetization Ms1 of the reference sample SPC1 is large. The saturation magnetization Ms1 of the reference sample SPC2 is smaller than the saturation magnetization Ms1 of the reference sample SPC1. The saturation magnetization Ms1 of the sample SP20 including the second region 22 including boron is smaller than the saturation magnetization of the reference sample SPC2.

As shown in FIG. 12, the saturation magnetization Ms1 becomes small when the thickness t2 of the second region 22 is 1 nm or more.

Figure 13:
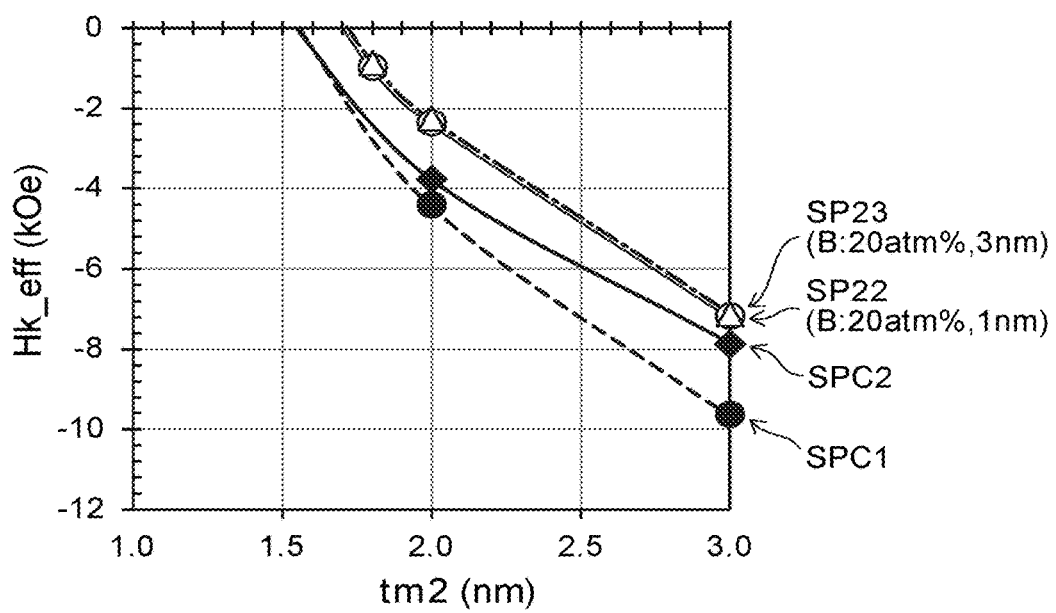
FIG. 13 is a graph illustrating a characteristic of the magnetic memory device.

FIG. 13 is a graph illustrating a characteristic of the magnetic memory device.

FIG. 13 shows the evaluation results of the perpendicular anisotropic magnetic field Hk_eff for a sample SP22, a sample SP23, the reference sample SPC1, and the reference sample SPC2. The sample SP22 and the sample SP23 have the stacked structure of "Ta/MgO/FeB/WB/Ta." In the sample SP22, the thickness t2 of the WB layer (the second region 22) is 1 nm; and the concentration of B in the WB layer is 20 at %. In the sample SP23, the thickness t2 of the WB layer (the second region 22) is 3 nm; and the concentration of B in the WB layer is 20 atm %. In the sample SP22 and the sample SP23, the thickness of the Ta layer is 10 nm. In the reference sample SPC1 and the reference sample SPC2, the second region 22 that includes boron is not provided. The reference sample SPC1 has the stacked structure of "Ta/MgO/FeB/Ta." The reference sample SPC2 has the stacked structure of "Ta/MgO/FeB/W/Ta." In the sample SPC2, the thickness of the W layer is 1 nm. In FIG. 13, the horizontal axis is the thickness tm2 (nm) of the FeB layer (the second magnetic layer 12). The vertical axis is the perpendicular anisotropic magnetic field Hk_eff (kOe) of the FeB layer (the second magnetic layer 12).

As shown in FIG. 13, the perpendicular anisotropic magnetic fields Hk_eff that are obtained for the samples SP22 and SP23 have absolute values that are smaller than those of the reference samples SPC1 and SPC2.

Figure 14A:
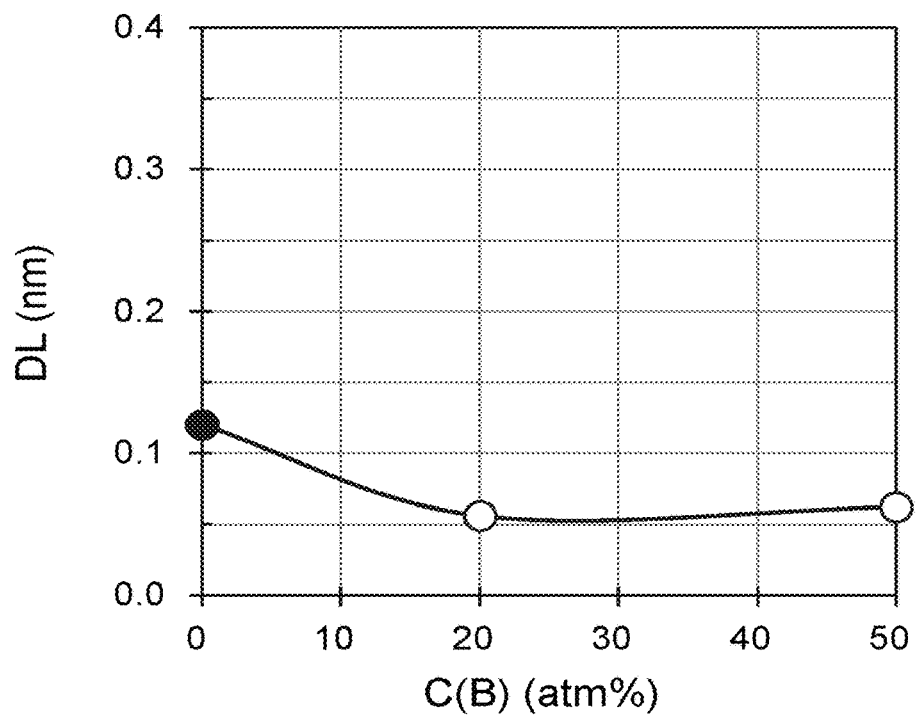
FIG. 14A and FIG. 14B are graphs illustrating characteristics of the magnetic memory device.
Figure 14B:
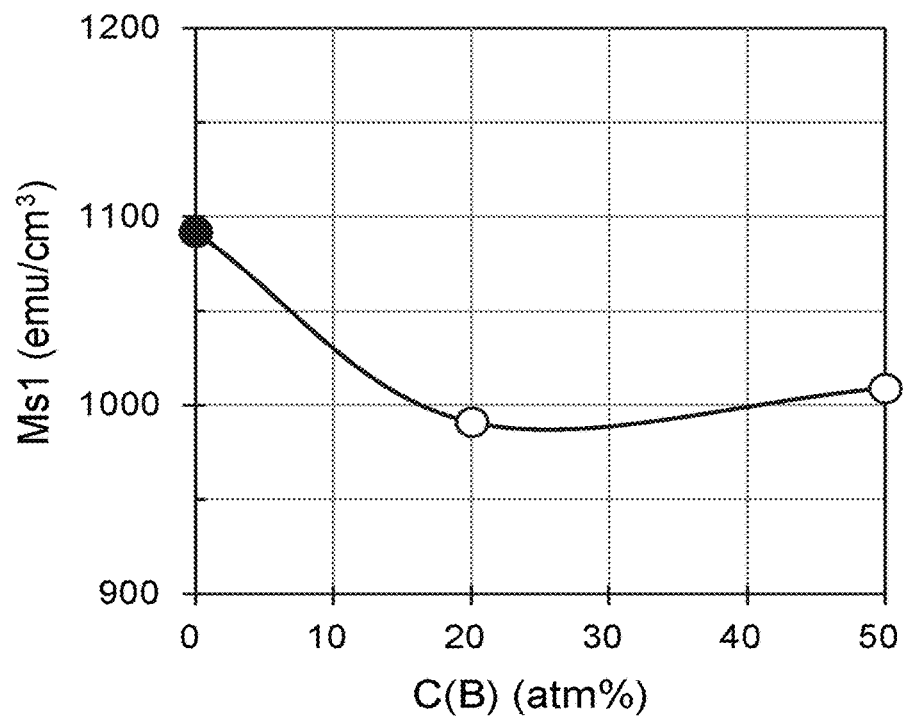

FIG. 14A and FIG. 14B are graphs illustrating characteristics of the magnetic memory device.

FIG. 14A shows the relationship between the concentration (the composition ratio) of boron in the second region 22 and the thickness DL of the magnetic dead layer in the case where the second region 22 includes WB. FIG. 14B shows the relationship between the concentration (the composition ratio) of boron in the second region 22 and the saturation magnetization Ms1 in the case where the second region 22 includes WB. The samples have the stacked structure of "Ta/MgO/FeB/WB/Ta" described in reference to FIG. 11. The thickness t2 of the second region 22 is 3 nm. Otherwise, the configurations of the samples are similar to the configurations of the samples described in reference to FIG. 11. In these figures, the horizontal axis is the concentration (the second concentration C(B)) of boron in the second region 22. In the case where the second concentration C(B) is 0%, the second region 22 is not provided. In this case, a Ta layer having a thickness of 10 nm is provided.

As shown in FIG. 14A, the thickness DL of the magnetic dead layer is small when the second concentration C(B) is 20 atm % or more. The thickness DL is substantially constant when the second concentration C(B) is not less than 20 atm % and not more than 50 atm %.

As shown in FIG. 14B, the saturation magnetization Ms1 is small when the second concentration C(B) is not less than 20 atm % and not more than 50 atm %.

In the embodiment, it is preferable that the second concentration C(B) is not less than 5 atm %. It is further preferable that the second concentration C(B) is not less than 10 atm %. It is preferable that the second concentration C(B) is not more than 60 atm %. It is further preferable that the second concentration C(B) is not more than 50 atm %.

By providing the second region 22 (the WB layer) as described in reference to FIG. 11, FIG. 12, FIG. 13, FIG. 14A, and FIG. 14B, for example, the thickness of the magnetic dead layer DL is small; the saturation magnetization Ms1 is small; and the absolute value of the perpendicular anisotropic magnetic field Hk_eff is small. Thereby, for example, the switching current density Jsw can be low. Thereby, for example, the write current can be reduced.

In the embodiment, the first metal that is included in the second region 22 may include multiple types of elements. For example, the second region 22 includes TaWB; and the first region 21 includes Ta. Even in the case where the second region 22 includes TaWB, for example, the write current can be reduced. The second region 22 may include, for example, at least one selected from the group consisting of TaWB, TaReB, TaOsB, TaIrB, TaPtB, TaAuB, TaCuB, TaAgB, TaPdB, WReB, WOsB, WIrB, WPtB, WAuB, WCuB, WAgB, WPdB, ReOsB, ReIrB, RePtB, ReAuB, ReCuB, ReAgB, RePdB, OsIrB, OsPtB, OsAuB, OsCuB, OsAgB, OsPdB, IrPtB, IrAuB, IrCuB, IrAgB, IrPdB, PtAuB, PtCuB, PtAgB, PtPdB, AuCuB, AuAgB, AuPdB, CuAgB, CuPdB, and AgPdBO.

In the embodiment, the first metal that is included in the second region 22 may include multiple types of elements. For example, the second region 22 includes TaHfB; and the first region 21 includes Ta. In the case where the second region 22 includes TaHfB, for example, the perpendicular anisotropic magnetic field Hk_eff having a small absolute value is obtained. For example, a high perpendicular magnetic anisotropy is obtained. For example, the write current can be reduced. For example, the first metal may include Hf and at least one selected from the group consisting of Ta, W, Re, Os, Ir, Pt, Au, Cu, Ag, and Pd. For example, the second region 22 may include at least one selected from the group consisting of TaHfB, WHfB, ReHfB, OsHfB, IrHfB, PtHfB, AuHfB, CuHfB, AgHfB, and PdHfB.

Generally, there is a tendency for a damping constant α of the second magnetic layer 12 provided on the conductive layer 20 to be high in the case where a heavy metal is used as the conductive layer 20. In the embodiment, the concentration of the light element in the second region 22 is set to be high by the second region 22 including boron. Thereby, for example, it is considered that a low damping constant α of the second magnetic layer 12 can be maintained. In the precessional switching mode, there is a tendency for the current density to be low due to the magnetization reversal when the damping constant α becomes small. In the embodiment, for example, the write current can be reduced because the damping constant α can be set to be small.

Figure 15:
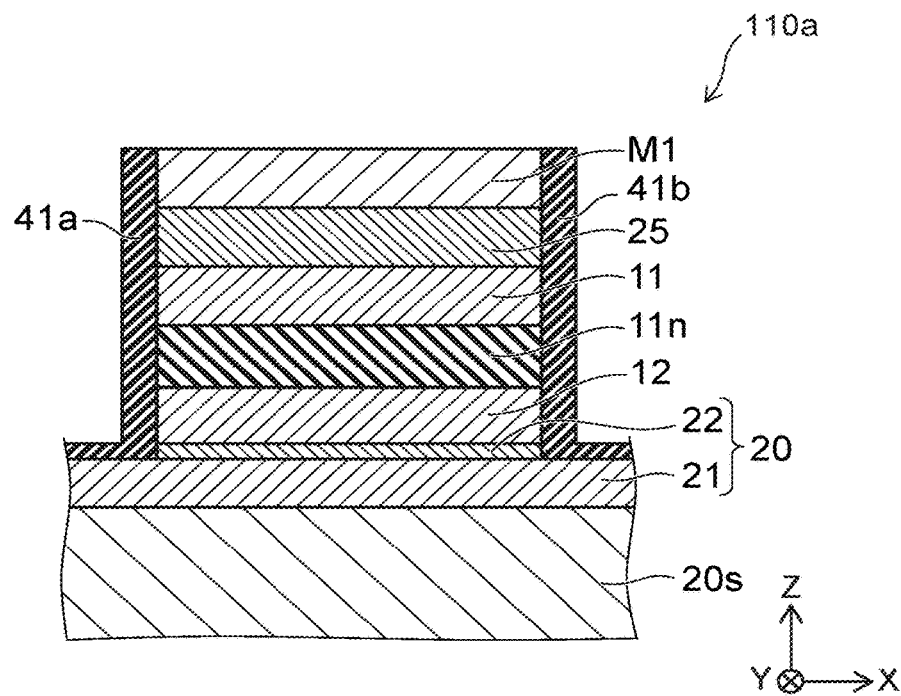
FIG. 15 is a schematic cross-sectional view illustrating a portion of another magnetic memory device according to the first embodiment.

FIG. 15 is a schematic cross-sectional view illustrating a portion of another magnetic memory device according to the first embodiment.

As shown in FIG. 15, the other magnetic memory device 110a according to the embodiment also includes the conductive layer 20, the first magnetic layer 11, the second magnetic layer 12, and the first nonmagnetic layer 11n. The controller 70 may be provided in the magnetic memory device 110a as well. The magnetic memory device 110a further includes a first boron compound region 41a and a second boron compound region 41b. In the example, the conductive layer 20 is provided on a lower layer 20s (including, for example, a substrate, etc.). Otherwise, the configuration of the magnetic memory device 110a is similar to the configuration of the magnetic memory device 110.

The first boron compound region 41a includes, for example, an oxide including boron. The second boron compound region 41b includes an oxide including boron.

The first magnetic layer 11 is between the first boron compound region 41a and the second boron compound region 41b in the second direction (e.g., the X-axis direction). The first nonmagnetic layer 11n is between the first boron compound region 41a and the second boron compound region 41b in the second direction. The second magnetic layer 12 is between the first boron compound region 41a and the second boron compound region 41b in the second direction. In the example, the second region 22 is between the first boron compound region 41a and the second boron compound region 41b in the second direction.

For example, such a first boron compound region 41a and such a second boron compound region 41b are formed as follows. When patterning the metal film that includes boron and is used to form the second region 22, for example, a film is formed by the adhesion of the element (the boron) included in the metal film to the side surfaces of the magnetic layers, the first nonmagnetic layer 11n, etc. For example, oxidation treatment or the like is performed to cause the film including boron adhered to the side surfaces to be insulative. Thereby, an oxide is formed in the first boron compound region 41a and the second boron compound region 41b. The metal film that includes boron is oxidized easily compared to a metal film that does not include boron. An insulative oxide is formed easily in the case where the first boron compound region 41a and the second boron compound region 41b include boron. For example, shorts are suppressed.

For example, a stacked film that includes a film used to form the second magnetic layer 12, a film used to form the first nonmagnetic layer 11n, and a film used to form the first magnetic layer 11 is formed on a metal stacked film used to form the conductive layer 20. In the example, a conductive film 25 (e.g., an electrode layer) is further provided on the film used to form the first magnetic layer 11. A hard mask M1 that has a prescribed configuration is provided on the stacked film. For example, the hard mask M1 may be omitted. The stacked film is patterned; and the second magnetic layer 12, the first nonmagnetic layer 11n, and the first magnetic layer 11 are obtained. In the patterning, a portion of the surface portion of the metal stacked film is adhered to the side surface of the stacked film. The first boron compound region 41a and the second boron compound region 41b can be formed by forming an oxide by performing oxidation treatment of the film adhered on the side surface.

In the embodiment, the metal film that is used to form the second region 22 includes boron. Therefore, the oxide that includes boron is formed on the side surface of the stacked film. For example, boron is oxidized easily compared to the first metal such as Ta, W, etc. The first boron compound region 41a and the second boron compound region 41b are formed easily. Good insulative properties of the side surface of the MTJ element are obtained by the first boron compound region 41a and the second boron compound region 41b.

In the magnetic memory device 110a, electrical shorts can be suppressed by the good insulative properties.

Figure 16:
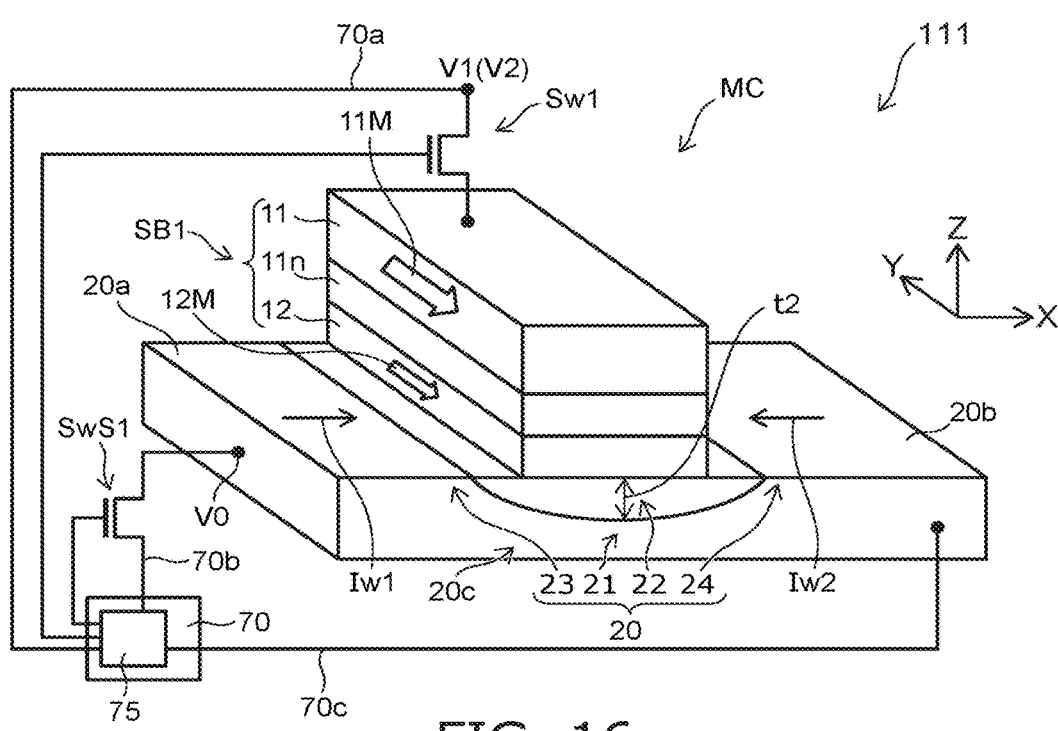
FIG. 16 is a schematic perspective view illustrating another magnetic memory device according to the first embodiment.

FIG. 16 is a schematic perspective view illustrating another magnetic memory device according to the first embodiment.

As shown in FIG. 16, the other magnetic memory device 111 according to the embodiment also includes the conductive layer 20, the first magnetic layer 11, the second magnetic layer 12, the first nonmagnetic layer 11n, and the controller 70. The configuration of the conductive layer 20 of the magnetic memory device 111 is different from that of the magnetic memory device 110. Otherwise, the configuration of the magnetic memory device 111 is similar to the configuration of the magnetic memory device 110.

In the magnetic memory device 111, the conductive layer 20 further includes a third region 23 and a fourth region 24 in addition to the first region 21 and the second region 22. The second region 22 is between the third region 23 and the fourth region 24 in the second direction (the X-axis direction). For example, the third region 23 and the fourth region 24 do not include boron. Or, the concentration of boron in the third region 23 and the concentration of boron in the fourth region 24 each are lower than the concentration (the second concentration) of boron in the second region 22. The third region 23 and the fourth region 24 are non-magnetic, for example.

In the magnetic memory device 111, a portion of the conductive layer 20 overlapping the second magnetic layer 12 locally includes boron. In the magnetic memory device 111, a portion of the conductive layer 20 not overlapping the second magnetic layer 12 (e.g., the third region 23 and the fourth region 24) has a composition similar to that of the first region 21. For example, the resistance of the conductive layer 20 can be low. For example, there is a tendency for the resistivity of the second region 22 to be higher than the resistivities of the first region 21, the third region 23, and the fourth region 24. The resistance of the conductive layer 20 can be low by locally providing the portion including boron.

Figure 17:
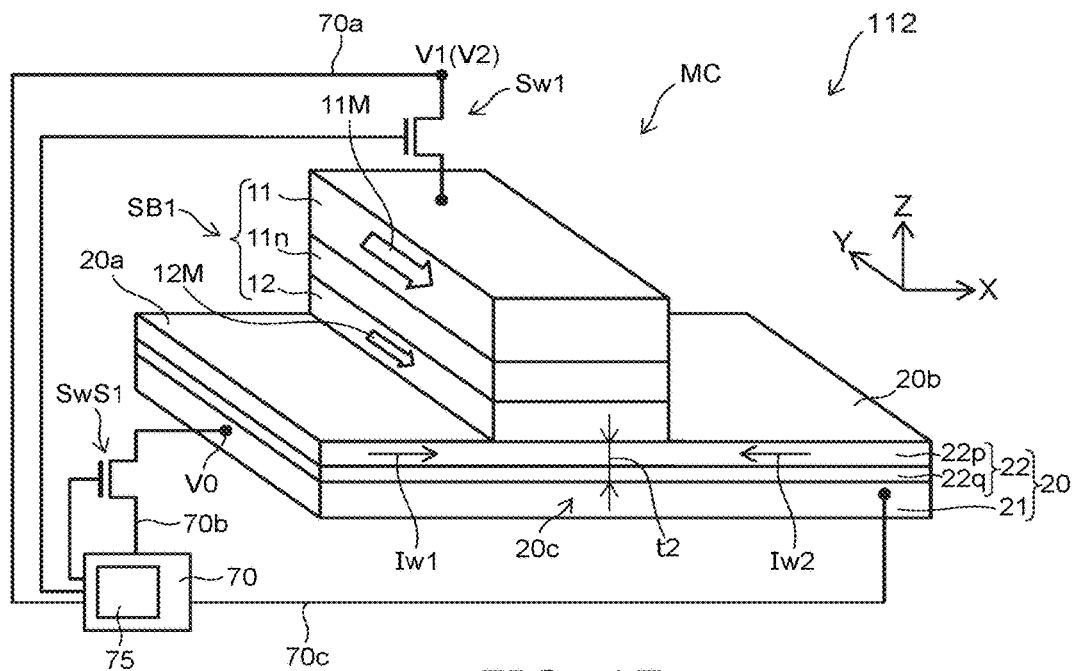
FIG. 17 is a schematic perspective view illustrating another magnetic memory device according to the first embodiment.

FIG. 17 is a schematic perspective view illustrating another magnetic memory device according to the first embodiment.

As shown in FIG. 17, the other magnetic memory device 112 according to the embodiment also includes the conductive layer 20, the first magnetic layer 11, the second magnetic layer 12, the first nonmagnetic layer 11n, and the controller 70. The configuration of the conductive layer 20 of the magnetic memory device 112 is different from that of the magnetic memory device 110. Otherwise, the configuration of the magnetic memory device 112 is similar to the configuration of the magnetic memory device 110.

In the magnetic memory device 112, the second region 22 includes a first partial region 22p and a second partial region 22q. The second partial region 22q is provided between the first partial region 22p and the first region 21. The composition of the first partial region 22p is different from the composition of the second partial region 22q.

For example, the concentration of boron in the first partial region 22p is different from the concentration of boron in the second partial region 22q. For example, the first metal in the first partial region 22p includes multiple types of elements; the first metal in the second partial region 22q includes one or more types of elements; and the composition of the first metal of the former is different from the composition of the first metal of the latter. For example, the concentration of oxygen in the first partial region 22p is different from the concentration of oxygen in the second partial region 22q.

For example, the first partial region 22p reduces the thickness of the magnetic dead layer DL of the second magnetic layer 12. For example, the first partial region 22p reduces the saturation magnetization Ms1 of the second magnetic layer 12. For example, the first partial region 22p increases the perpendicular anisotropic magnetic field Hk_eff. For example, the first partial region 22p reduces the damping constant α. For example, the second partial region 22q increases the spin Hall angle θSH.

In the magnetic memory devices 110, 110a, 111, and 112 recited above, the first magnetization 11M of the first magnetic layer 11 is aligned with the third direction (e.g., the Y-axis direction). The third direction crosses the first direction and the second direction. For example, the second magnetization 12M of the second magnetic layer 12 is substantially aligned with the third direction.

In these magnetic memory devices, for example, the length in one direction (the length in the major-axis direction) of the first magnetic layer 11 is longer than the length in one other direction (the minor-axis direction length) of the first magnetic layer 11. The major-axis direction of the first magnetic layer 11 crosses the second direction (e.g., the X-axis direction). The major-axis direction of the first magnetic layer 11 is aligned with the third direction (e.g., the Y-axis direction). For example, the length (the length in the major-axis direction) along the third direction (e.g., the Y-axis direction) of the first magnetic layer 11 is longer than the length (the minor-axis direction length) along the second direction (e.g., the X-axis direction) of the first magnetic layer 11.

The angle (the absolute value) between the major-axis direction of the first magnetic layer 11 and the second direction (e.g., the X-axis direction, i.e., the direction of the current flowing through the conductive layer 20) is not less than 30 degrees and not more than 90 degrees. In such a configuration, for example, the write current decreases easily.

Figure 18:
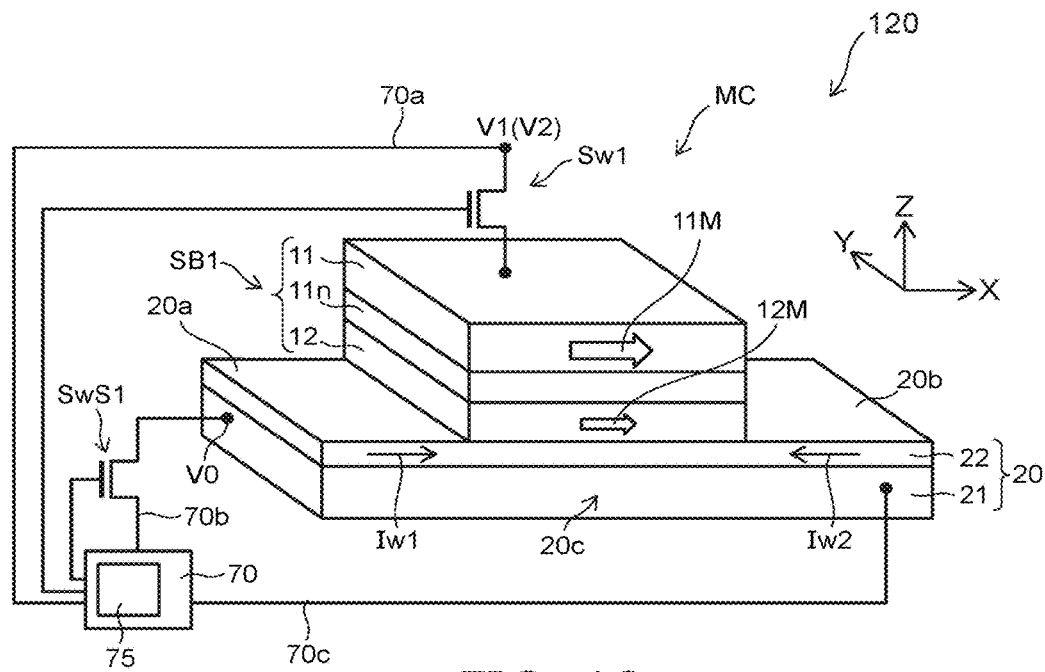
FIG. 18 is a schematic perspective view illustrating another magnetic memory device according to the first embodiment.

FIG. 18 is a schematic perspective view illustrating another magnetic memory device according to the first embodiment.

As shown in FIG. 18, the other magnetic memory device 120 according to the embodiment also includes the conductive layer 20, the first magnetic layer 11, the second magnetic layer 12, the first nonmagnetic layer 11n, and the controller 70. In the magnetic memory device 120, the direction of the first magnetization 11M of the first magnetic layer 11 is different from that of the magnetic memory device 110. Otherwise, the configuration of the magnetic memory device 120 is similar to the configuration of the magnetic memory device 110.

In the magnetic memory device 120, the first magnetization 11M of the first magnetic layer 11 is aligned with the second direction (e.g., the X-axis direction). For example, the second magnetization 12M of the second magnetic layer 12 is substantially aligned with the second direction.

In the magnetic memory device 120, for example, an operation having a direct switching mode is performed. The speed of the magnetization reversal in the direct switching mode is higher than the speed of the magnetization reversal in the precessional switching mode. In the direct switching mode, the magnetization reversal does not accompany precession. Therefore, the magnetization reversal rate is independent of the damping constant cc. In the magnetic memory device 120, a high-speed magnetization reversal is obtained.

In the magnetic memory device 120, for example, the length in one direction (the length in the major-axis direction) of the first magnetic layer 11 is longer than the length in one other direction (the minor-axis direction length) of the first magnetic layer 11. For example, the length (the length in the major-axis direction) along the second direction (e.g., the X-axis direction) of the first magnetic layer 11 is longer than the length (the minor-axis direction length) along the third direction (e.g., the Y-axis direction) of the first magnetic layer 11. For example, the first magnetization 11M of the first magnetic layer 11 is easily aligned with the second direction due to the shape anisotropy.

In the magnetic memory device 120, for example, the major-axis direction of the first magnetic layer 11 is aligned with the second direction. The major-axis direction of the first magnetic layer 11 may be tilted with respect to the second direction. For example, the angle (the absolute value) between the major-axis direction of the first magnetic layer 11 and the second direction (a direction corresponding to the direction of the current flowing through the conductive layer 20) is, for example, not less than 0 degrees but less than 30 degrees. In such a configuration, for example, a high writing speed is obtained.

Figure 19:
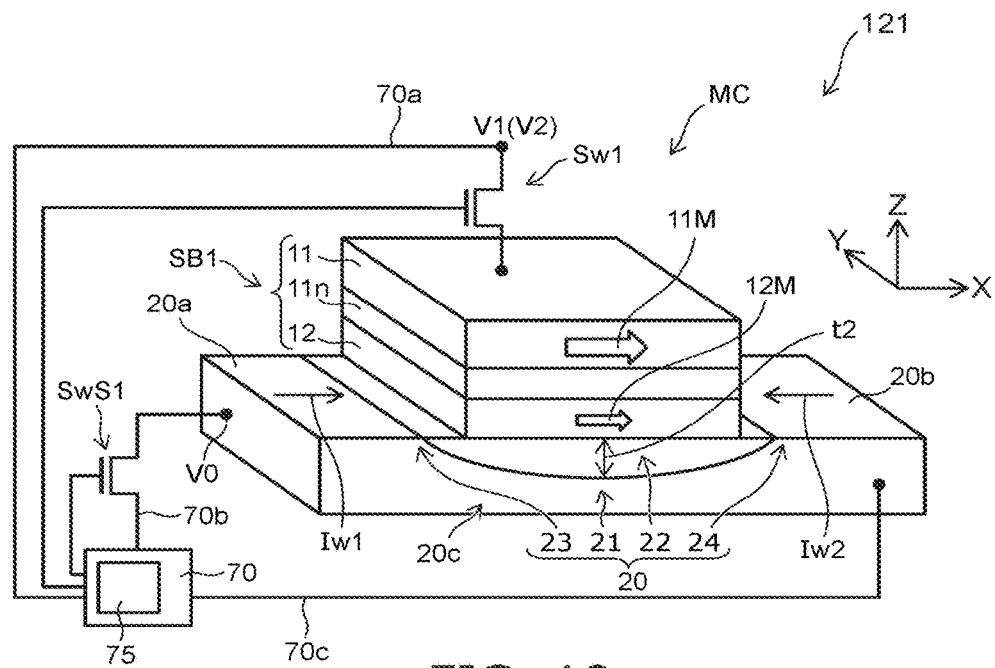
FIG. 19 is a schematic perspective view illustrating another magnetic memory device according to the first embodiment.

FIG. 19 is a schematic perspective view illustrating another magnetic memory device according to the first embodiment.

As shown in FIG. 19, the other magnetic memory device 121 according to the embodiment also includes the conductive layer 20, the first magnetic layer 11, the second magnetic layer 12, the first nonmagnetic layer 11n, and the controller 70. In the magnetic memory device 121, the conductive layer 20 includes the first region 21, the second region 22, the third region 23, and the fourth region 24 described above. Otherwise, the configuration of the magnetic memory device 121 is similar to the configuration of the magnetic memory device 120.

Figure 20:
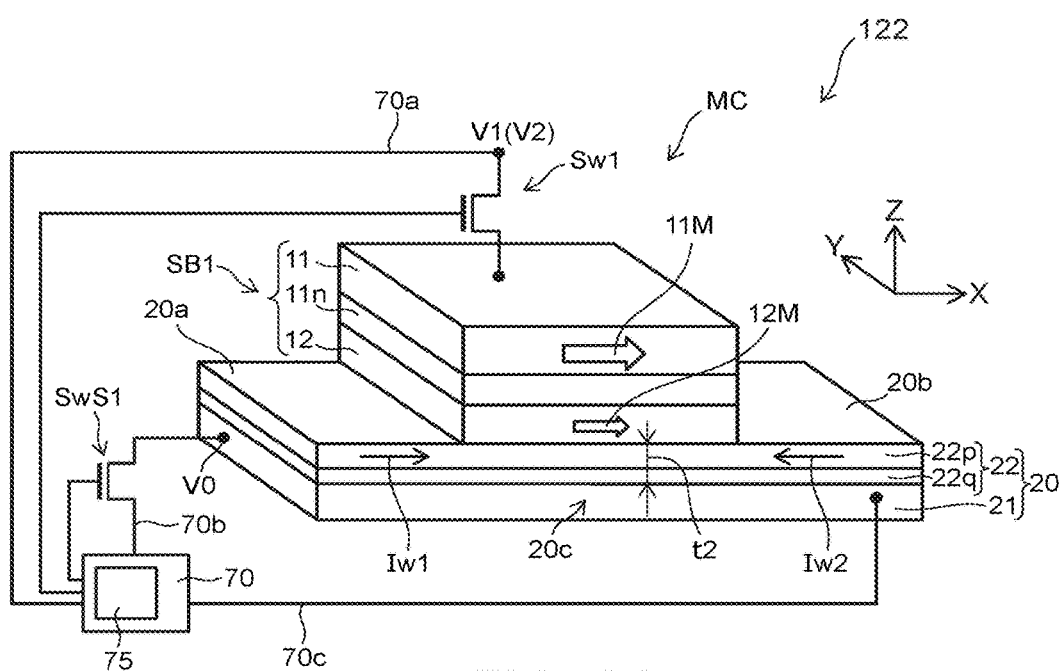
FIG. 20 is a schematic perspective view illustrating another magnetic memory device according to the first embodiment.

FIG. 20 is a schematic perspective view illustrating another magnetic memory device according to the first embodiment.

As shown in FIG. 20, the other magnetic memory device 122 according to the embodiment also includes the conductive layer 20, the first magnetic layer 11, the second magnetic layer 12, the first nonmagnetic layer 11n, and the controller 70. In the magnetic memory device 122, the second region 22 includes the first partial region 22p and the second partial region 22q described above. Otherwise, the configuration of the magnetic memory device 122 is similar to the configuration of the magnetic memory device 120.

Figure 21:
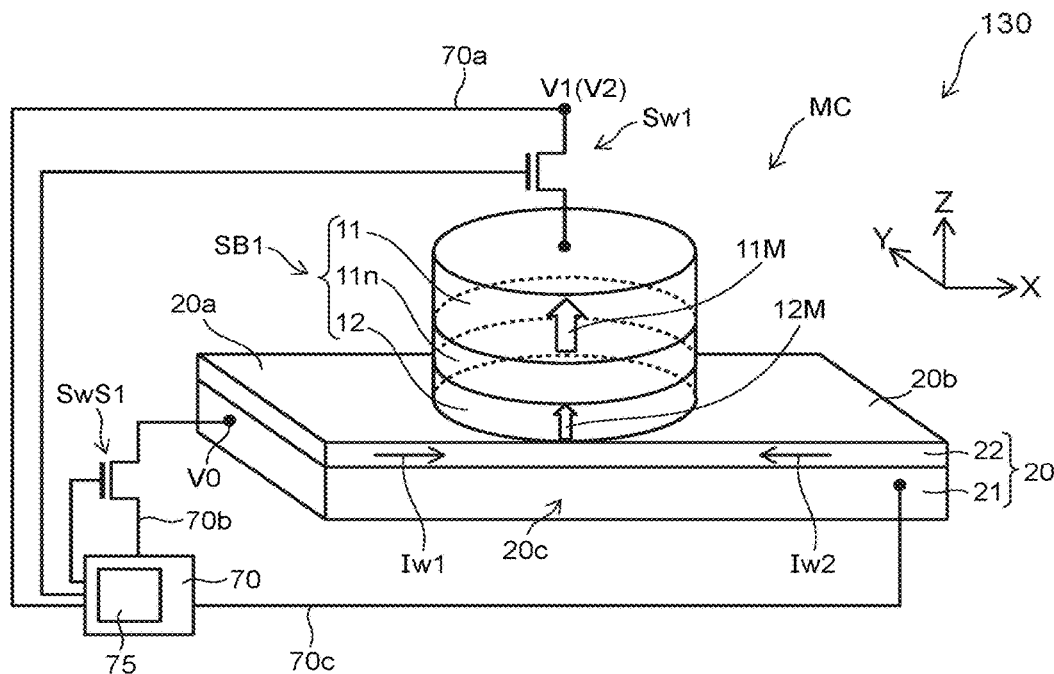
FIG. 21 is a schematic perspective view illustrating another magnetic memory device according to the first embodiment.

FIG. 21 is a schematic perspective view illustrating another magnetic memory device according to the first embodiment.

As shown in FIG. 21, the other magnetic memory device 130 according to the embodiment also includes the conductive layer 20, the first magnetic layer 11, the second magnetic layer 12, the first nonmagnetic layer 11n, and the controller 70. In the magnetic memory device 130, the direction of the first magnetization 11M of the first magnetic layer 11 is different from that of the magnetic memory device 110. Otherwise, the configuration of the magnetic memory device 130 is similar to the configuration of the magnetic memory device 110.

In the magnetic memory device 130, the first magnetization 11M of the first magnetic layer 11 is aligned with the first direction (e.g., the Z-axis direction). For example, the second magnetization 12M of the second magnetic layer 12 is substantially aligned with the first direction.

In the magnetic memory device 130 as well, for example, an operation having a direct switching mode is performed. In the magnetic memory device 130, a high-speed magnetization reversal is obtained.

In the magnetic memory device 130, for example, the length along the second direction of the first magnetic layer 11 may be substantially the same as the length along the third direction of the first magnetic layer 11. In the magnetic memory device 130, a fine first stacked body SB1 (e.g., a MTJ element) is obtained easily. For example, a high storage density is obtained.

Figure 22:
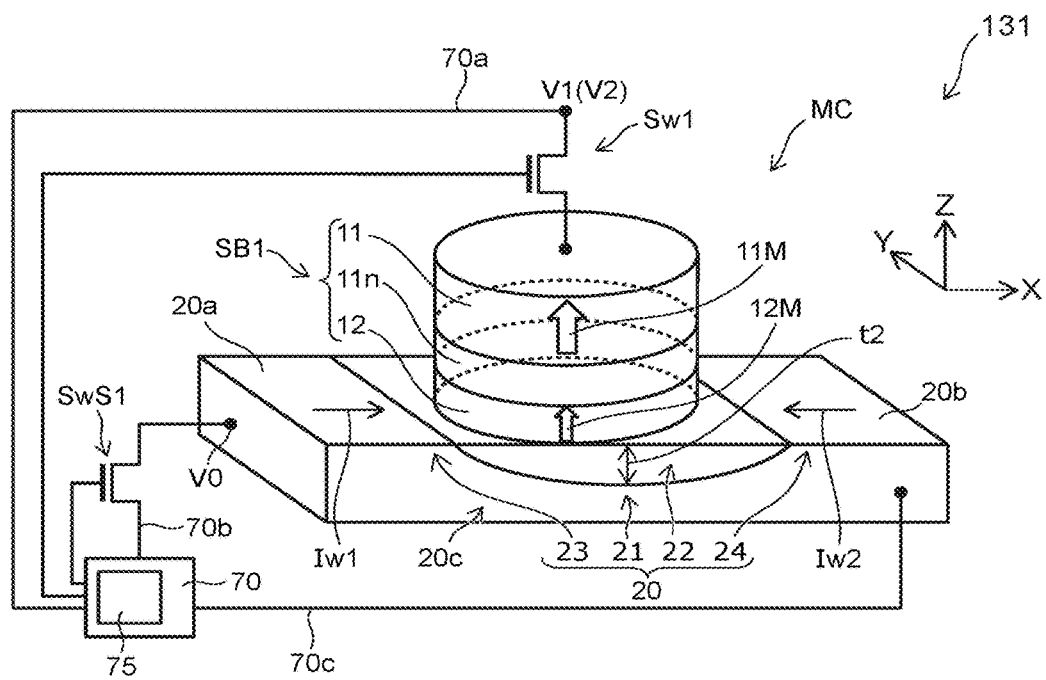
FIG. 22 is a schematic perspective view illustrating another magnetic memory device according to the first embodiment.

FIG. 22 is a schematic perspective view illustrating another magnetic memory device according to the first embodiment.

As shown in FIG. 22, the other magnetic memory device 131 according to the embodiment also includes the conductive layer 20, the first magnetic layer 11, the second magnetic layer 12, the first nonmagnetic layer 11n, and the controller 70. In the magnetic memory device 131, the conductive layer 20 includes the first region 21, the second region 22, the third region 23, and the fourth region 24 described above. Otherwise, the configuration of the magnetic memory device 131 is similar to the configuration of the magnetic memory device 130.

Figure 23:
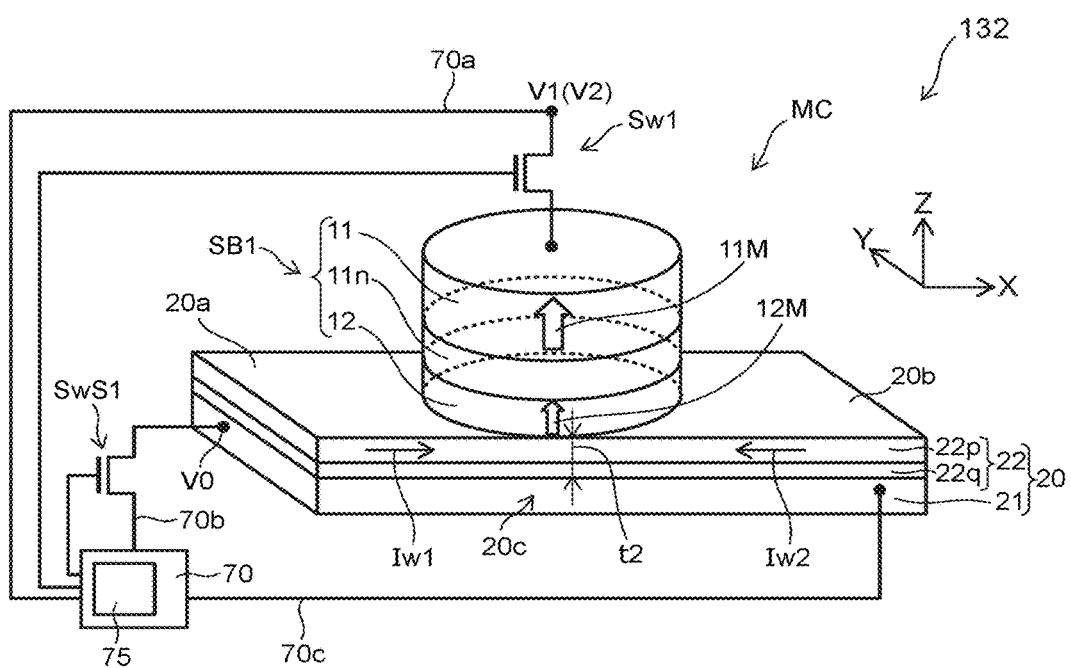
FIG. 23 is a schematic perspective view illustrating another magnetic memory device according to the first embodiment.

FIG. 23 is a schematic perspective view illustrating another magnetic memory device according to the first embodiment.

As shown in FIG. 23, the other magnetic memory device 132 according to the embodiment also includes the conductive layer 20, the first magnetic layer 11, the second magnetic layer 12, the first nonmagnetic layer 11n, and the controller 70. In the magnetic memory device 132, the second region 22 includes the first partial region 22p and the second partial region 22q described above. Otherwise, the configuration of the magnetic memory device 132 is similar to the configuration of the magnetic memory device 130.

In the magnetic memory devices 110a, 111, 112, 120, 121, 122, 130, 131, and 132 as well, for example, the thickness of the magnetic dead layer DL is small; the saturation magnetization Ms1 is small; and the absolute value of the perpendicular anisotropic magnetic field Hk_eff is small. For example, the spin Hall angle θSH that has a large absolute value is obtained. Thereby, for example, the switching current density Jsw can be low. Thereby, for example, the write current can be reduced. The first boron compound region 41a and the second boron compound region 41b described above may be provided in the magnetic memory devices 111, 112, 120, 121, 122, 130, 131, and 132.

In the first embodiment, the second magnetic layer 12 includes, for example, at least one first element selected from the group consisting of Co, Fe, and Ni. The second magnetic layer 12 may further include boron. The second magnetic layer 12 may further include at least one second element selected from the group consisting of C, N, O, Si, and P. In the second magnetic layer 12, the concentration of boron and the second element is, for example, 30 atm % or less. Thereby, for example, at least one of the lattice constant, the crystallinity, the magnetic properties, the mechanical properties, or the chemical properties can be controlled. By using such a material, for example, a high spin polarization ratio is obtained. For example, the second magnetic layer 12 includes at least one selected from the group consisting of Co, Fe, CoFe, CoFeB, FeB, CoB, CoFeSi, CoFeP, FeNi, FeNiB, FeNiSi, and FeNiP. The second magnetic layer 12 may include a stacked film including multiple films having different compositions. The second magnetic layer 12 includes, for example, CoFeB/CoFe or CoFeB/FeNiB. The second magnetic layer 12 may include, for example, a stacked film including multiple CoFeB films having mutually-different compositions. The second magnetic layer 12 may include, for example, a stacked film including multiple CoFe films having mutually-different compositions.

The second magnetic layer 12 may include, for example, a magnetic layer including a Co-based Heusler alloy. The Co-based Heusler alloy is notated as $Co_2YZ$. The second magnetic layer 12 includes at least one selected from the group consisting of $Co_2FeAl$, $Co_2MnSi$, $Co_2MnGe$, $Co_2Mn(Si, Ge)$, and $Co_2Mn(Ga, Ge)$.

In the specific examples recited above, the materials and the thicknesses are selected appropriately. For example, shape magnetic anisotropy is induced markedly for a prescribed thickness. Characteristics as an in-plane magnetization film are obtained. For example, interface-perpendicular magnetic anisotropy is induced markedly for a prescribed thickness. The characteristics as a perpendicular magnetization film are obtained.

The second magnetic layer 12 may have, for example, a stacked structure. The stacked structure is, for example, a SAF structure. In the SAF structure, for example, the effects of the stray magnetic field on the adjacent bits can be reduced.

The stacked structure includes, for example, CoFe(B)/(Ta, W, Mo, Cu, Cr)/CoFe(B), a Co-based Heusler alloy/(Ta, W, Mo, Cu, Cr)/CoFe(B), etc. The notation "(Ta, W, Mo, Cu, Cr)" means the inclusion of at least one selected from the group consisting of Ta, W, Mo, Cu, and Cr. The SAF structure includes, for example, at least one selected from the group consisting of CoFe(B)/(Ru, Rh, Ir)/CoFe(B) and a Co-based Heusler alloy/(Ru, Rh, Ir)/CoFe(B). The notation "(Ru, Rh, Ir)" means the inclusion of at least one selected from the group consisting of Ru, Rh, and Ir. The notation "(B)" means that B is included, or B is substantially not included.

The second magnetic layer 12 may include a perpendicular magnetic film. An example of the case where the second magnetic layer 12 is a perpendicular magnetic film is as follows. The second magnetic layer 12 includes Mn and at least one element. The at least one element includes at least one selected from the group consisting of Al, Ge, and Ga. The second magnetic layer 12 includes, for example, at least one selected from the group consisting of MnGa, MnAl, MnGe, and MnAlGe. For example, the second magnetic layer 12 includes Mn, Ga, and at least one element. The at least one element includes at least one selected from the group consisting of Al, Ge, Ir, Cr, Co, Pt, Ru, Pd, Rh, Ni, Fe, Re, Au, Cu, B, C, P, Gd, Tb, and Dy. The second magnetic layer 12 includes, for example, at least one selected from the group consisting of MnGaAl, MnGaGe, MnGaIr, MnGaCr, MnGaCo, MnGaPt, MnGaRu, MnGaPd, MnGaRh, MnGaNi, MnGaFe, MnGaRe, MnGaAu, MnGaCu, MnGaB, MnGaC, MnGaP, MnGaGd, MnGaTb, and MnGaDy.

In the case where the second magnetic layer 12 includes a perpendicular magnetic film, the second magnetic layer 12 may include, for example, an alloy. The alloy includes one element and another one element. The one element includes, for example, at least one selected from the group consisting of Fe, Co, and Ni. The other one element includes, for example, at least one selected from the group consisting of Ru, Rh, Pd, Ag, Ir, Pt, and Au. The alloy recited above may include, for example, at least one selected from the group consisting of FeRh, FePt, FePd, CoPt, and CoPd. These alloys are, for example, ferromagnetic alloys.

The second magnetic layer 12 may include a stacked body. The stacked body includes, for example, at least one selected from the group consisting of a Co/Pt artificial lattice, a Co/Pd artificial lattice, a Co/Ru artificial lattice, a Co/Ir artificial lattice, and a Co/Au artificial lattice. In these artificial lattices, the addition of elements and the ratio of the thicknesses of the magnetic films and the nonmagnetic film are adjusted. Thereby, for example, the perpendicular magnetic anisotropy and the saturation magnetization are adjusted.

In the specific examples recited above, the materials and the crystal orientations are selected appropriately. For example, the characteristics as an in-plane magnetization film or a perpendicular magnetization film are obtained by controlling the orientation of the crystal orientation.

The first magnetic layer 11 has at least one of a coercivity that is larger than the coercivity of the second magnetic layer 12, a magnetic anisotropy energy that is larger than the magnetic anisotropy energy of the second magnetic layer 12, or a damping constant that is larger than the damping constant of the second magnetic layer 12. Thereby, the change of the electrical resistance of the MTJ element is obtained stably. The first magnetic layer 11 may include a stacked film including a first layer and a second layer. The first layer includes, for example, Mn and at least one element selected from the group consisting of Ir, Pt, Fe, and Rh. The second layer includes at least one element selected from the group consisting of Co, Fe, and Ni. The first magnetic layer 11 includes, for example, at least one selected from the group consisting of IrMn/CoFe, PtMn/CoFe, FeMn/CoFe, and RhMn/CoFe. For example, a stable magnetization direction is obtained. The first magnetic layer 11 may include the first layer, the second layer, a third layer, and a fourth layer. The fourth layer is provided between the third layer and the second layer. For example, the third layer contacts the first nonmagnetic layer 11n and has, for example, a high spin polarization ratio. The first magnetic layer 11 includes, for example, at least one selected from the group consisting of IrMn/CoFe/Ru/CoFeB, PtMn/CoFe/Ru/CoFeB, FeMn/CoFe/Ru/CoFeB, and RhMn/CoFe/Ru/CoFeB. Thereby, for example, a stable magnetization direction is obtained. For example, the change of the electrical resistance of the MTJ element is obtained stably.

The first magnetic layer 11 may include, for example, a perpendicular magnetic film. In the case where the first magnetic layer 11 includes a perpendicular magnetic film, for example, the first magnetic layer 11 includes Mn and at least one element. The at least one element includes at least one selected from Al, Ge, and Ga. The first magnetic layer 11 includes, for example, at least one selected from the group consisting of MnGa, MnAl, MnGe, and MnAlGe. For example, the first magnetic layer 11 includes Mn, Ga, and at least one element. The at least one element includes at least one selected from the group consisting of Al, Ge, Ir, Cr, Co, Pt, Ru, Pd, Rh, Ni, Fe, Re, Au, Cu, B, C, P, Gd, Tb, and Dy. The first magnetic layer 11 includes, for example, at least one selected from the group consisting of MnGaAl, MnGaGe, MnGaIr, MnGaCr, MnGaCo, MnGaPt, MnGaRu, MnGaPd, MnGaRh, MnGaNi, MnGaFe, MnGaRe, MnGaAu, MnGaCu, MnGaB, MnGaC, MnGaP, MnGaGd, MnGaTb, and MnGaDy.

In the case where the first magnetic layer 11 includes a perpendicular magnetic film, the first magnetic layer 11 may include, for example, an alloy. The crystal of at least a portion of the alloy is oriented in, for example, the (111) orientation of a face-centered cubic structure (FCC). Or, the crystal of at least a portion of the alloy is oriented in the (0001) orientation of a hexagonal close-packed structure (HCP). The alloy that is included in the first magnetic layer 11 may form, for example, an artificial lattice. For example, the alloy recited above that has the FCC (111) crystal orientation or the HCP (0001) crystal orientation includes, for example, one element and another one elements. The one element includes at least one selected from the group consisting of Fe, Co, Ni, and Cu. The other one element includes at least one selected from the group consisting of Pt, Pd, Rh, and Au. The alloy that is included in the first magnetic layer 11 is, for example, a ferromagnetic alloy. The ferromagnetic alloy includes, for example, at least one selected from the group consisting of CoPd, CoPt, NiCo, and NiPt.

The alloy recited above that is included in the first magnetic layer 11 and may form the artificial lattice includes, for example, the first layer and the second layer stacked alternately. The first layer includes, for example, an alloy (a ferromagnetic film) including one element selected from the group consisting of Fe, Co, and Ni. The second layer includes, for example, an alloy (a nonmagnetic film) including one element selected from the group consisting of Cr, Pt, Pd, Ir, Rh, Ru, Os, Re, Au, and Cu. The first magnetic layer 11 includes, for example, at least one selected from the group consisting of a Co/Pt artificial lattice, a Co/Pd artificial lattice, a CoCr/Pt artificial lattice, a Co/Ru artificial lattice, a Co/Ir artificial lattice, a Co/Os artificial lattice, a Co/Au artificial lattice, and a Ni/Cu artificial lattice. In these artificial lattices, at least one of the addition of elements to the ferromagnetic film or the ratio of the thicknesses of the ferromagnetic films and the nonmagnetic film is adjusted. At least one of the perpendicular magnetic anisotropy or the saturation magnetization may be adjusted.

The first magnetic layer 11 may include an alloy. The alloy includes one element and another one element. The one element includes at least one selected from the group consisting of Fe, Co, and Ni. The one element is, for example, a transition metal. The other one element includes, for example, at least one selected from the group consisting of Tb, Dy, and Gd. The other one element is, for example, a rare-earth metal. The first magnetic layer 11 includes, for example, at least one selected from the group consisting of TbFe, TbCo, TbFeCo, DyTbFeCo, and GdTbCo. The first magnetic layer 11 may include a stacked body. The stacked body includes multiple layers. Each of the multiple layers includes the alloys recited above. In the stacked body, multiple types of layers may be stacked alternately. The first magnetic layer 11 may include, for example, at least one stacked body selected from the group consisting of TbFe/Co, TbCo/Fe, TbFeCo/CoFe, DyFe/Co, DyCo/Fe, and DyFeCo/CoFe. In these alloys, for example, at least one of the thickness or the composition is adjusted. For example, at least one of the perpendicular magnetic anisotropy or the saturation magnetization is adjusted.

The first magnetic layer 11 may include an alloy. The alloy includes one element and another one element. The one element includes at least one selected from the group consisting of Fe, Co, Ni, and Cu. The other one element includes at least one selected from the group consisting of Pt, Pd, Rh, and Au. The first magnetic layer 11 includes, for example, a ferromagnetic alloy. The ferromagnetic alloy includes at least one selected from the group consisting of FeRh, FePt, FePd, CoPt, and CoPd.

The first nonmagnetic layer 11n includes, for example, at least one selected from the group consisting of MgO, MgAlO, and AlO. The first nonmagnetic layer 11n may include a stacked film including multiple films including these materials. The first nonmagnetic layer 11n may further include another nonmagnetic metal.

Second Embodiment

Figure 24:
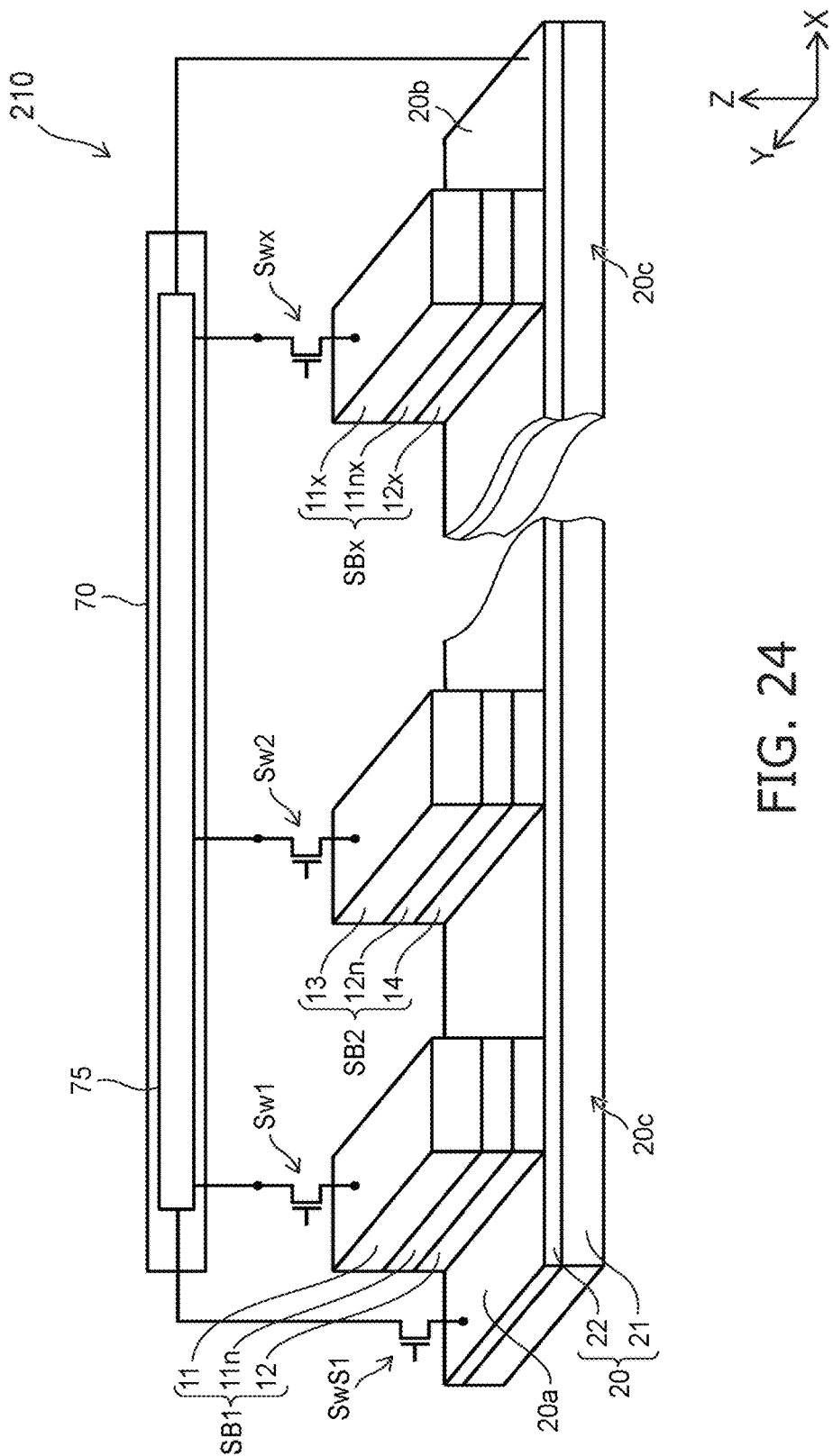
FIG. 24 is a schematic perspective view illustrating a magnetic memory device according to a second embodiment.

FIG. 24 is a schematic perspective view illustrating a magnetic memory device according to a second embodiment.

As shown in FIG. 24, multiple stacked bodies (the first stacked body SB1, a second stacked body SB2, a stacked body SBx, etc.) are provided in the magnetic memory device 210 according to the embodiment. Multiple switches (the switch Sw1, a switch Sw2, a switch Swx, etc.) also are provided. Otherwise, the configuration of the magnetic memory device 210 is similar to that of the magnetic memory device 110.

Multiple stacked bodies are arranged along the conductive layer 20. For example, the second stacked body SB2 includes a third magnetic layer 13, a fourth magnetic layer 14, and a second nonmagnetic layer 12n. The third magnetic layer 13 is separated from a portion of the conductive layer 20 in the first direction (the Z-axis direction). The fourth magnetic layer 14 is provided between the third magnetic layer 13 and the portion of the conductive layer 20. The second nonmagnetic layer 12n is provided between the third magnetic layer 13 and the fourth magnetic layer 14.

For example, the third magnetic layer 13 is separated from the first magnetic layer 11 in the second direction (e.g., the X-axis direction). The fourth magnetic layer 14 is separated from the second magnetic layer 12 in the second direction. The second nonmagnetic layer 12n is separated from the first nonmagnetic layer 11n in the second direction.

For example, the stacked body SBx includes a magnetic layer 11x, a magnetic layer 12x, and a nonmagnetic layer 11nx. The magnetic layer 11x is separated from another portion of the conductive layer 20 in the first direction (the Z-axis direction). The magnetic layer 12x is provided between the magnetic layer 11x and the other portion of the conductive layer 20. The nonmagnetic layer 11nx is provided between the magnetic layer 11x and the magnetic layer 12x.

For example, the material and configuration of the third magnetic layer 13 are the same as the material and configuration of the first magnetic layer 11. For example, the material and configuration of the fourth magnetic layer 14 are the same as the material and configuration of the second magnetic layer 12. For example, the material and configuration of the second nonmagnetic layer 12n are the same as the material and configuration of the first nonmagnetic layer 11n.

The multiple stacked bodies function as the multiple memory cells MC.

The second region 22 of the conductive layer 20 is provided also between the fourth magnetic layer 14 and the first region 21. The second region 22 of the conductive layer 20 is provided also between the magnetic layer 12x and the first region 21.

The switch Sw1 is electrically connected to the first magnetic layer 11. The switch Sw2 is electrically connected to the third magnetic layer 13. The switch Swx is electrically connected to the magnetic layer 11x. These switches are electrically connected to the control circuit 75 of the controller 70. These switches select one of the multiple stacked bodies.

In the example of the magnetic memory device 210, the second region 22 extends along the second direction (e.g., the X-axis direction). The second region 22 is provided also in a region corresponding to the region between the multiple stacked bodies.

Figure 25:
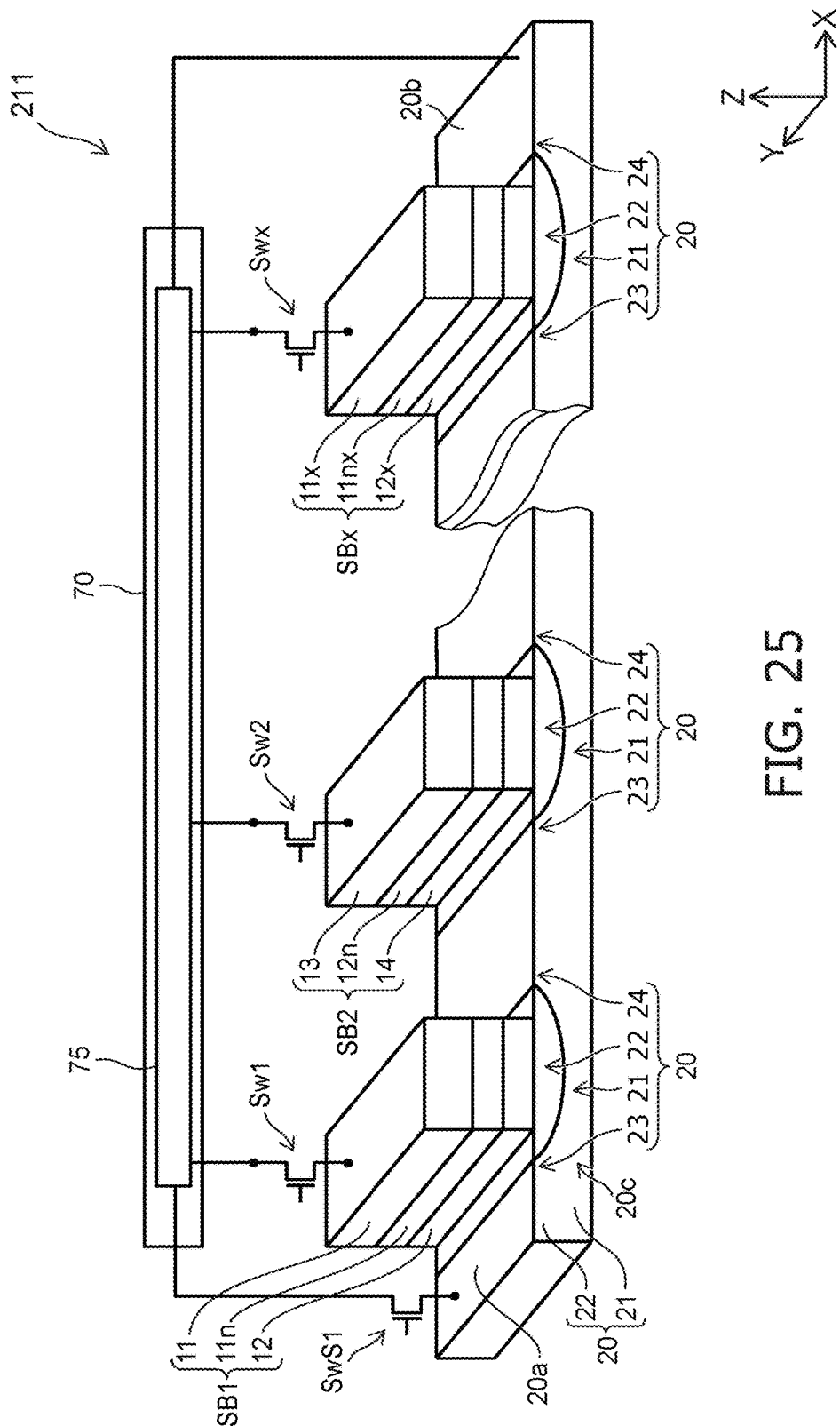
FIG. 25 is a schematic perspective view illustrating another magnetic memory device according to the second embodiment.

FIG. 25 is a schematic perspective view illustrating another magnetic memory device according to the second embodiment.

As shown in FIG. 25, multiple stacked bodies and multiple switches are provided in the other magnetic memory device 211 according to the embodiment as well. Otherwise, the configuration of the magnetic memory device 211 is similar to the magnetic memory device 111.

In the magnetic memory device 211, the second region 22 that includes boron is locally provided between the first region 21 and each of the multiple stacked bodies.

Figure 26:
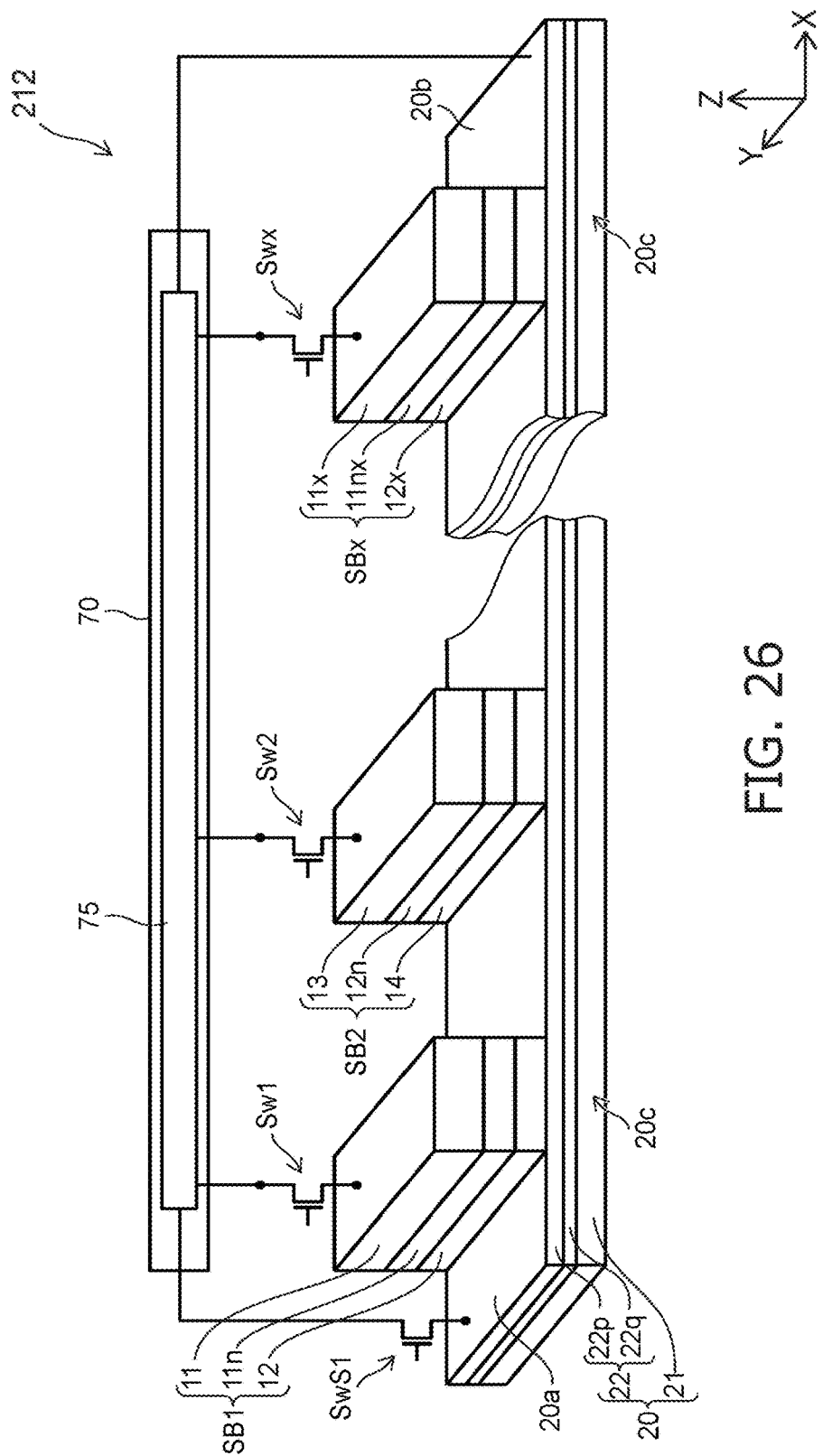
FIG. 26 is a schematic perspective view illustrating another magnetic memory device according to the second embodiment.

FIG. 26 is a schematic perspective view illustrating another magnetic memory device according to the second embodiment.

As shown in FIG. 26, multiple stacked bodies and multiple switches are provided in the other magnetic memory device 212 according to the embodiment as well. Otherwise, the configuration of the magnetic memory device 212 is similar to that of the magnetic memory device 112.

In the magnetic memory device 212, the second region 22 includes the first partial region 22p and the second partial region 22q.

In the magnetic memory devices 210, 211, and 212 as well, for example, the write current can be reduced.

Multiple stacked bodies that have the configurations of the magnetic memory devices 120 to 122 and 130 to 132 may be provided. For example, the write current can be reduced in these magnetic memory devices as well.

Third Embodiment

Figure 27:
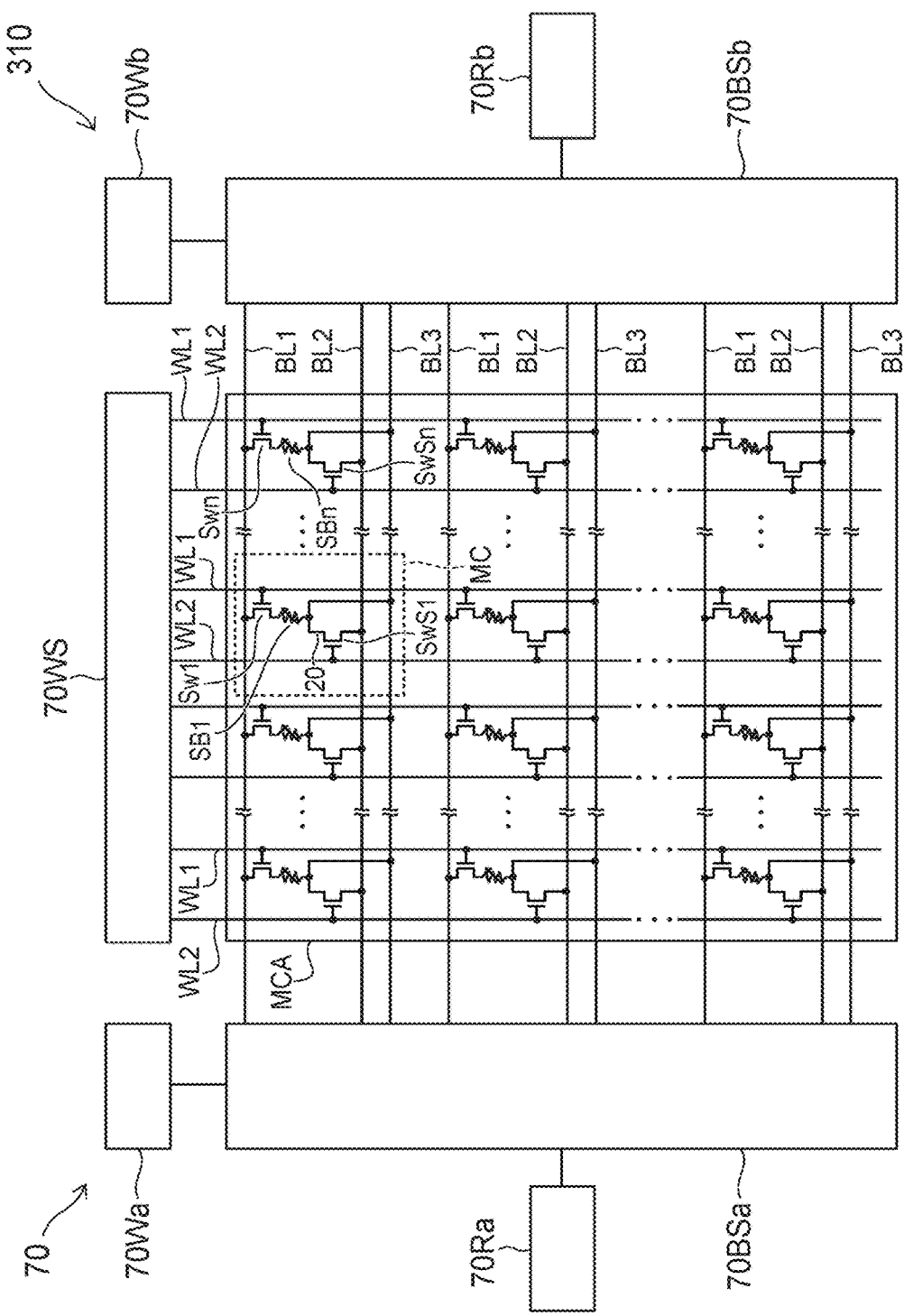
FIG. 27 is a schematic view showing a magnetic memory device according to a third embodiment.
Figure 28:
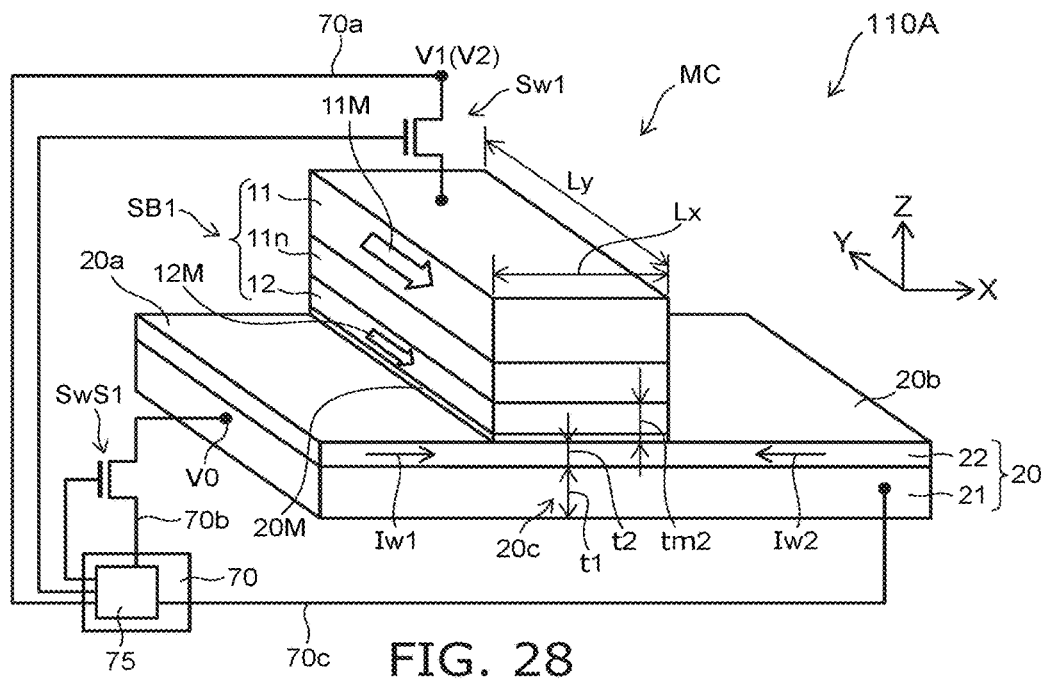
FIG. 28 is a schematic view showing a magnetic memory device according to other embodiments.
Figure 29:
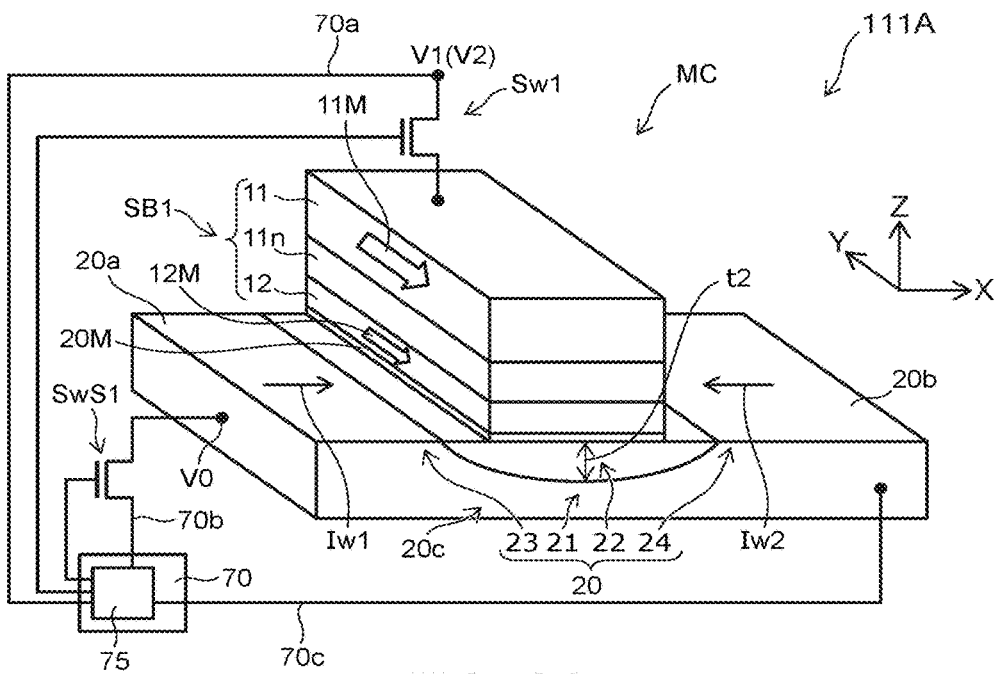
FIG. 29 is a schematic view showing a magnetic memory device according to other embodiments.
Figure 30:
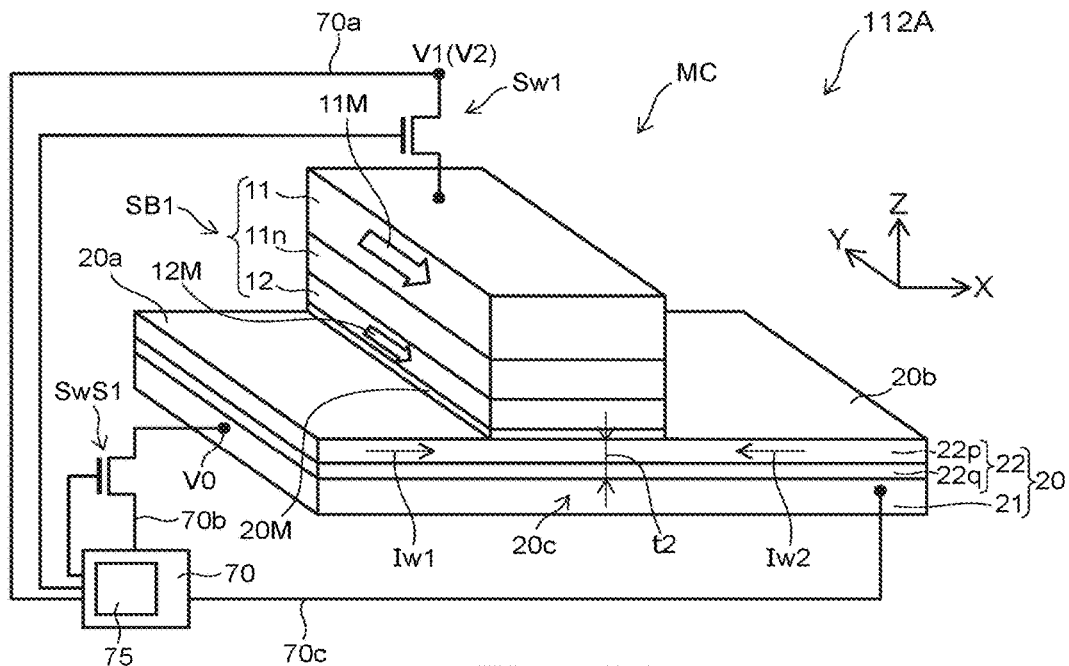
FIG. 30 is a schematic view showing a magnetic memory device according to other embodiments.
Figure 31:
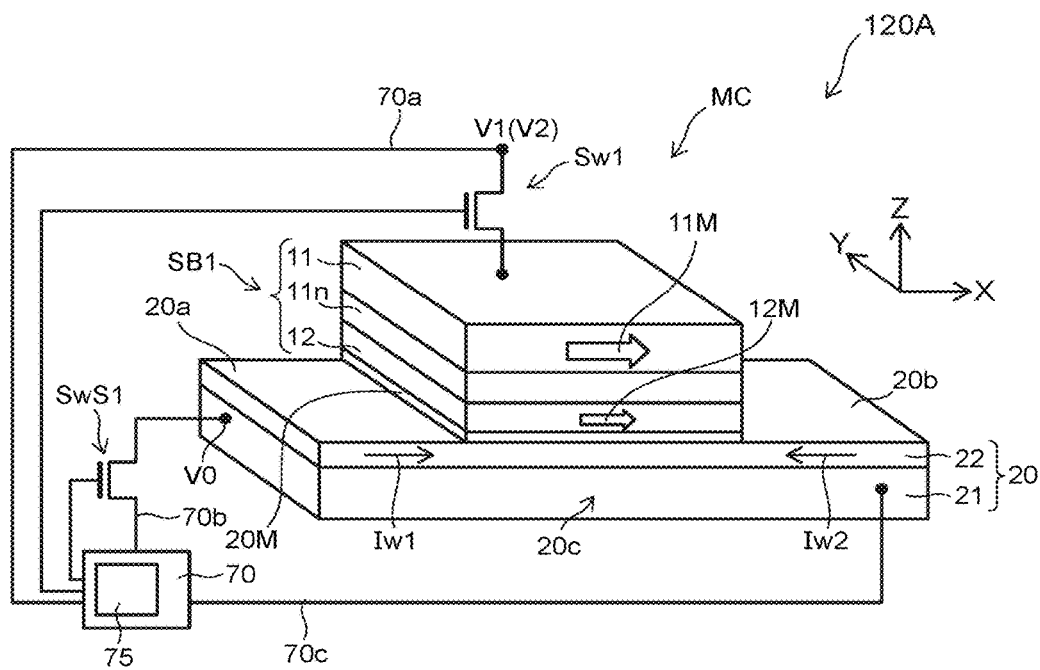
FIG. 31 is a schematic view showing a magnetic memory device according to other embodiments.
Figure 32:
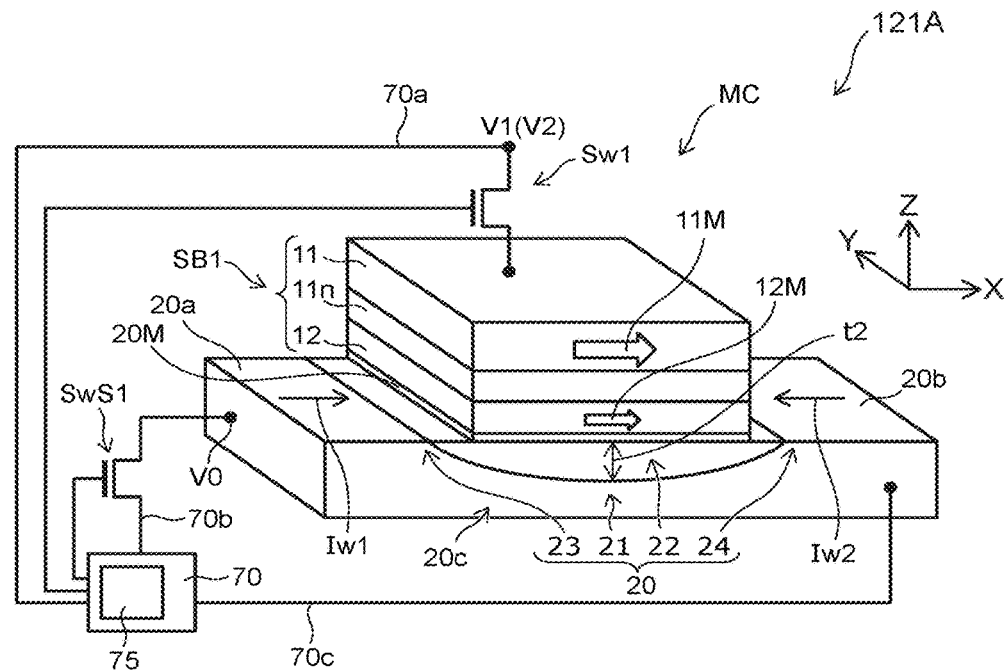
FIG. 32 is a schematic view showing a magnetic memory device according to other embodiments.
Figure 33:
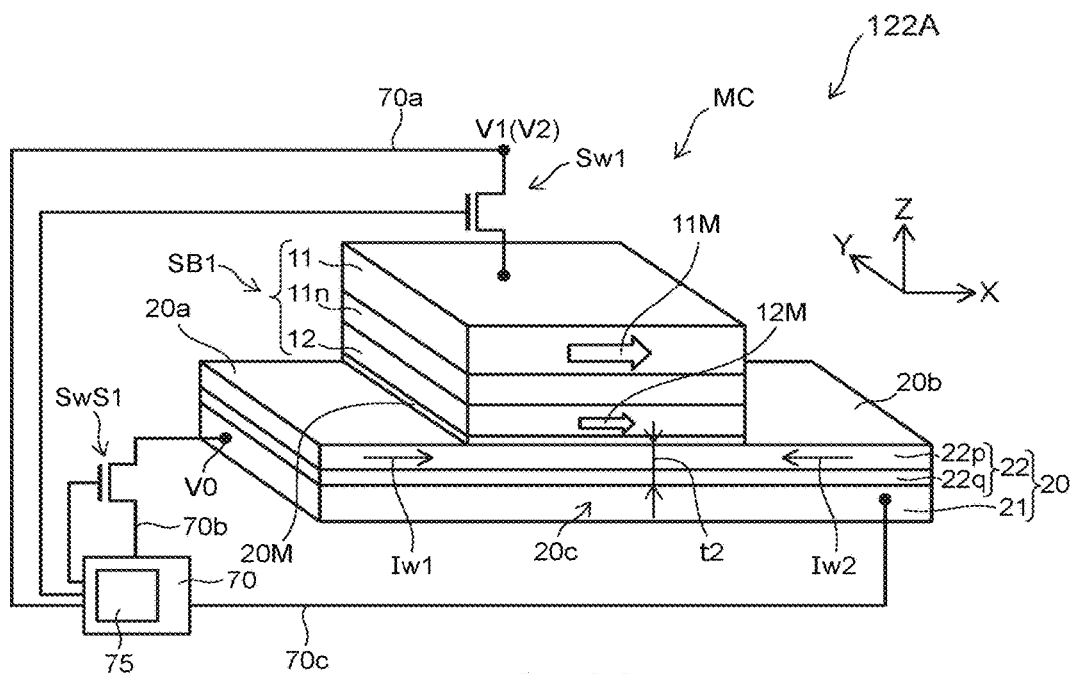
FIG. 33 is a schematic view showing a magnetic memory device according to other embodiments.
Figure 34:
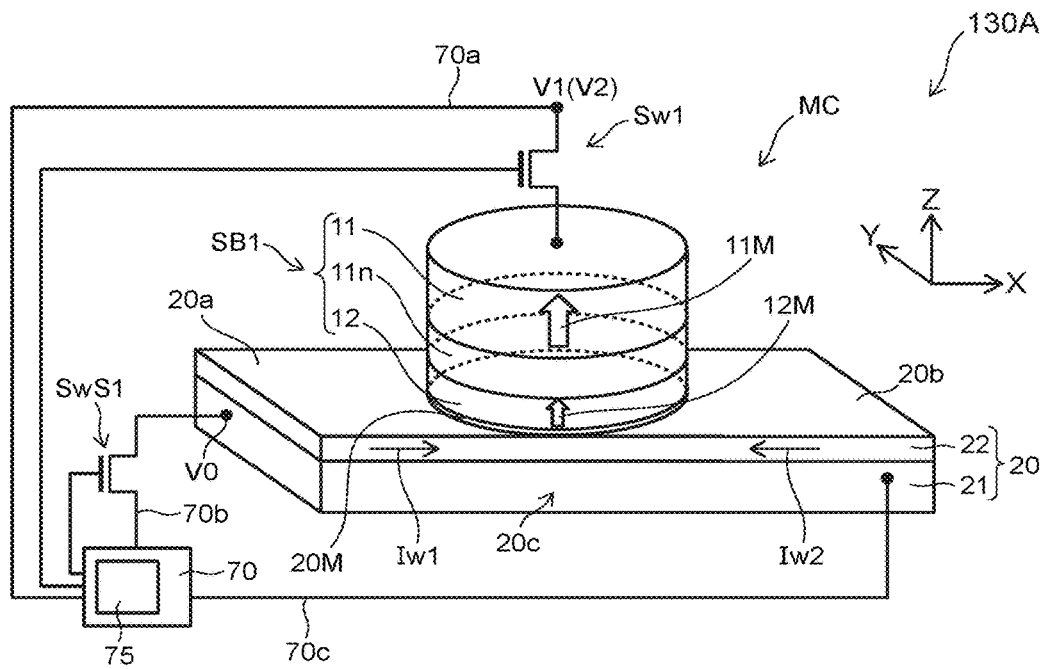
FIG. 34 is a schematic view showing a magnetic memory device according to other embodiments.
Figure 35:
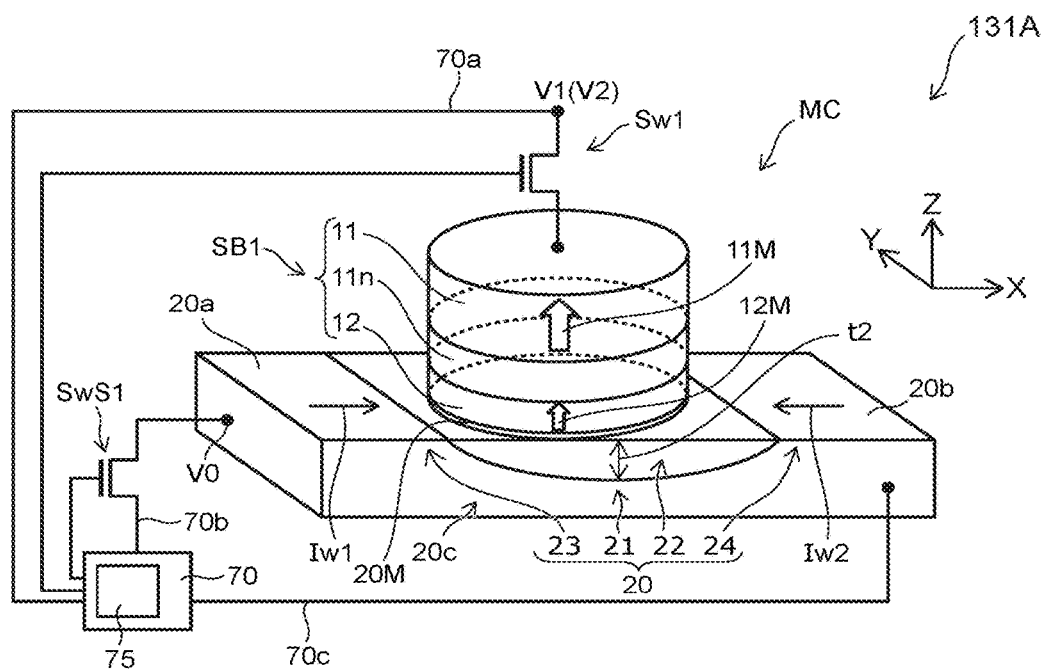
FIG. 35 is a schematic view showing a magnetic memory device according to other embodiments.
Figure 36:
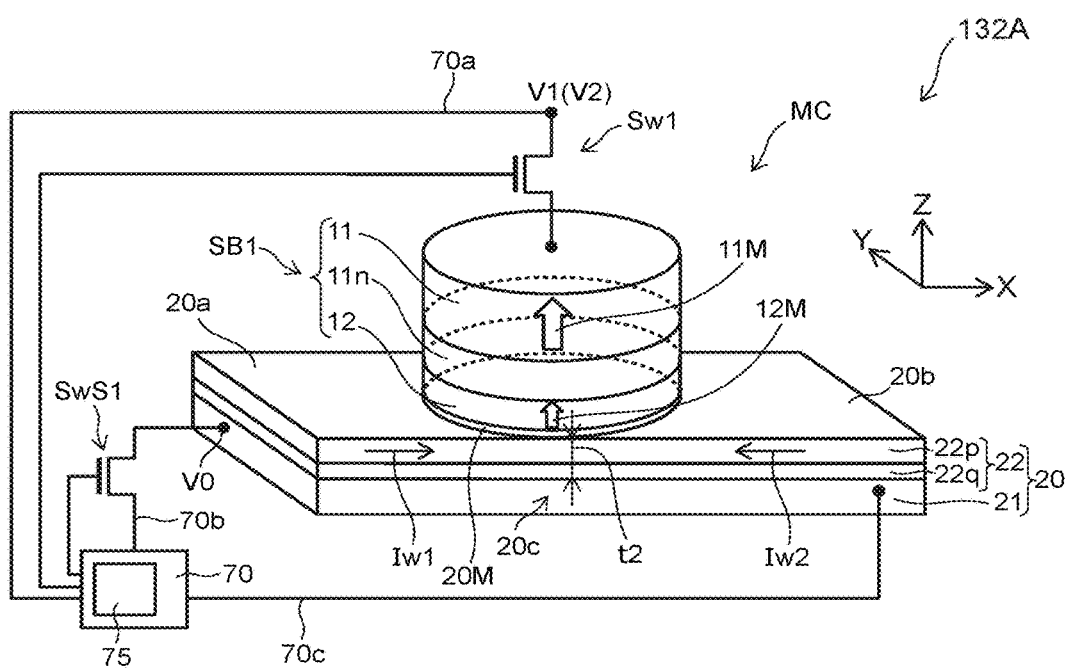
FIG. 36 is a schematic view showing a magnetic memory device according to other embodiments.
Figure 37:
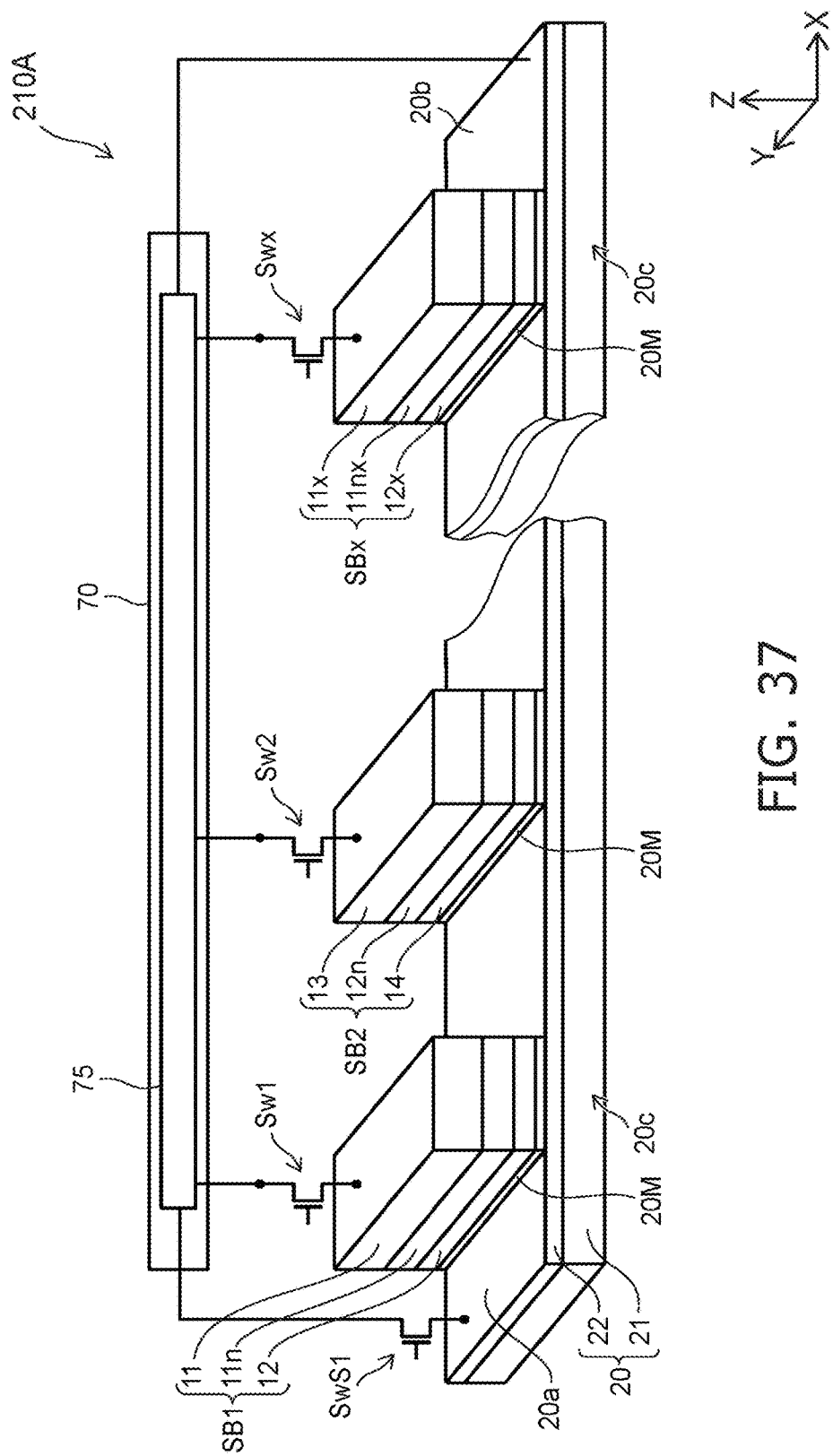
FIG. 37 is a schematic view showing a magnetic memory device according to other embodiments.
Figure 38:
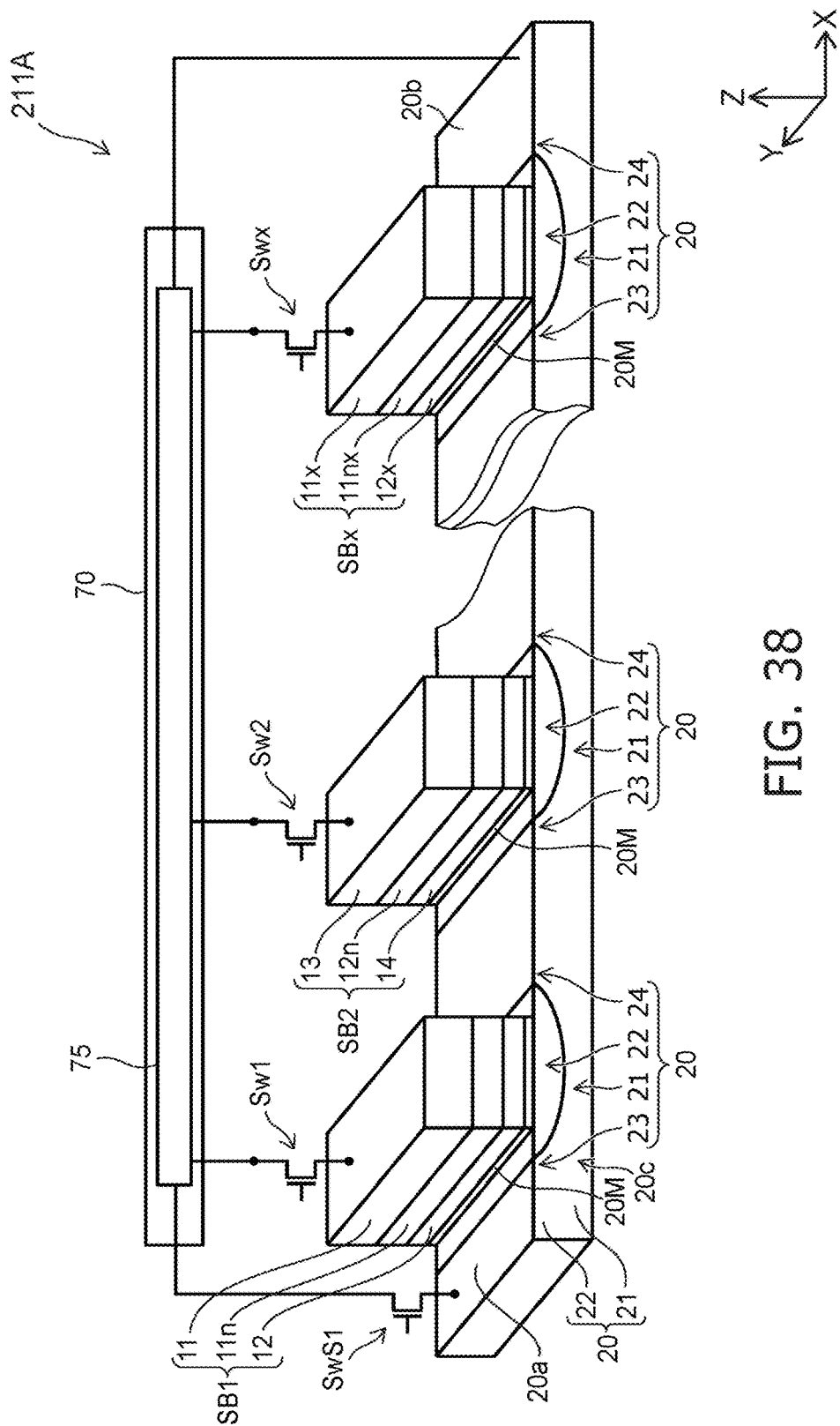
FIG. 38 is a schematic view showing a magnetic memory device according to other embodiments.
Figure 39:
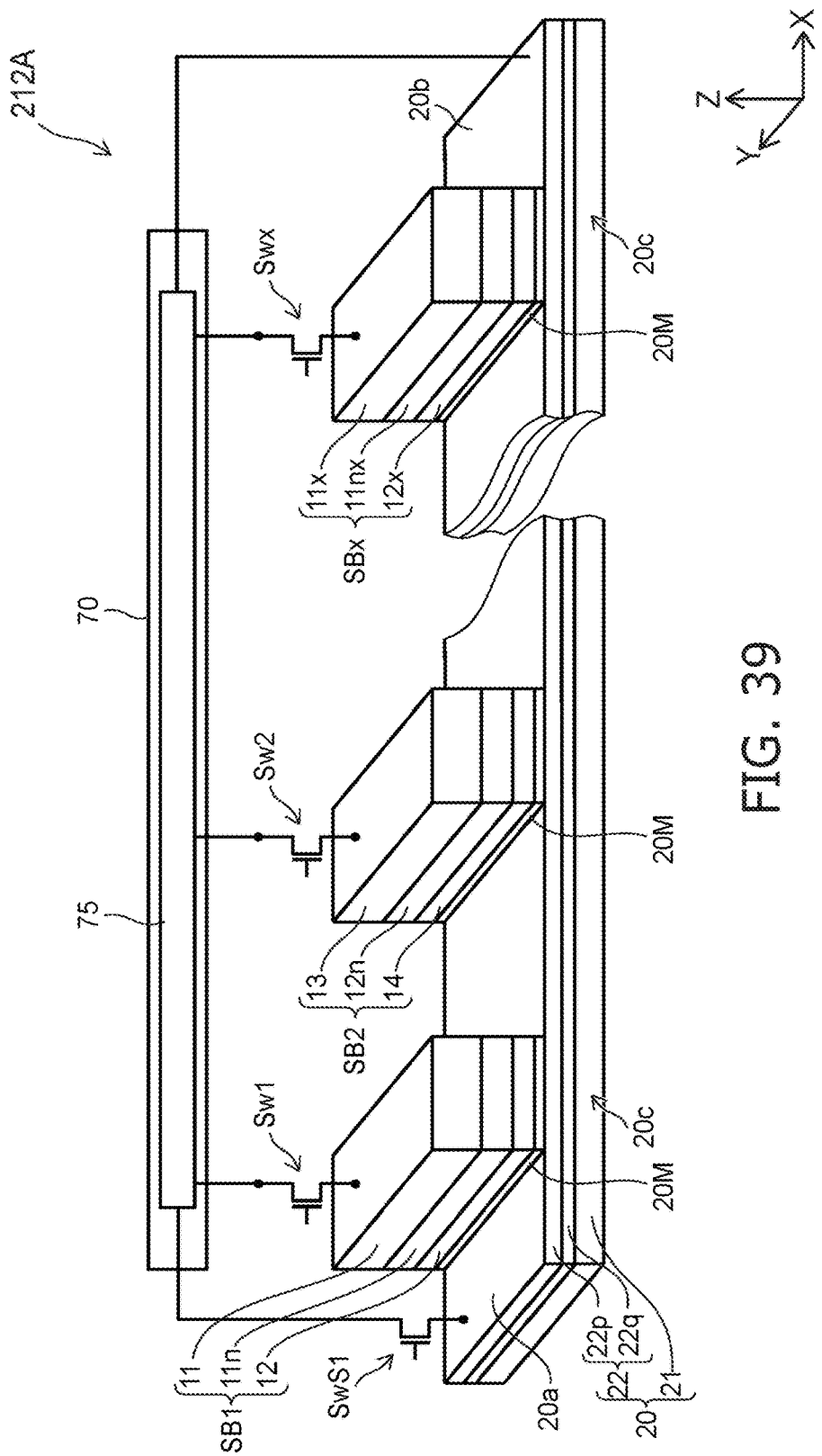
FIG. 39 is a schematic view showing a magnetic memory device according to other embodiments.

FIG. 27 is a schematic view showing a magnetic memory device according to a third embodiment.

As shown in FIG. 27, a memory cell array MCA, multiple first interconnects (e.g., word lines WL1, WL2, etc.), multiple second interconnects (e.g., bit lines BL1, BL2, BL3, etc.), and the controller 70 are provided in the magnetic memory device 310 according to the embodiment. The multiple first interconnects extend in one direction. The multiple second interconnects extend in another one direction. The controller 70 includes a word line selection circuit 70WS, a first bit line selection circuit 70BSa, a second bit line selection circuit 70BSb, a first write circuit 70Wa, a second write circuit 70Wb, a first read circuit 70Ra, and a second read circuit 70Rb. The multiple memory cells MC are arranged in an array configuration in the memory cell array MCA.

For example, the switch Sw1 and the switch SwS1 are provided to correspond to one of the multiple memory cells MC. These switches are considered to be included in the one of the multiple memory cells. These switches may be considered to be included in the controller 70. These switches are, for example, transistors. The one of the multiple memory cells MC includes, for example, a stacked body (e.g., the first stacked body SB1).

As described in reference to FIG. 24 to FIG. 26, multiple stacked bodies (the first stacked body SB1, the second stacked body SB2, the stacked body SBx, etc.) may be provided for one conductive layer 20. Multiple switches (the switch Sw1, the switch Sw2, the switch Swx, etc.) may be provided respectively at the multiple stacked bodies. In FIG. 27, one stacked body (the stacked body SB1 or the like) and one switch (the switch Sw1 or the like) are drawn to correspond to one conductive layer 20 for easier viewing of the drawing.

As shown in FIG. 27, one end of the first stacked body SB1 is connected to the conductive layer 20. The other end of the first stacked body SB1 is connected to one of the source or the drain of the switch Sw1. The other of the source or the drain of the switch Sw1 is connected to the bit line BL1. The gate of the switch Sw1 is connected to the word line WL1. One end (e.g., the first portion 20a) of the conductive layer 20 is connected to one of the source or the drain of the switch SwS1. The other end (e.g., the second portion 20b) of the conductive layer 20 is connected to the bit line BL3. The other of the source or the drain of the switch SwS1 is connected to the bit line BL2. The gate of the switch SwS1 is connected to the word line WL2.

The stacked body SBn, the switch Swn, and a switch SwSn are provided in another one of the multiple memory cells MC.

An example of the write operation of information to the memory cell MC will now be described.

The switch SwS1 of one memory cell MC (the selected memory cell) to which the writing is to be performed is set to the ON state. For example, the ON state is formed by setting the word line WL2 connected to the gate of the one switch SwS1 to a high-level potential. The setting of the potential is performed by the word line selection circuit 70WS. The switch SwS1 is set to the ON state also for the other memory cells MC (the unselected memory cells) of the column including the one memory cell MC (the selected memory cell) recited above. The word line WL1 that is connected to the gate of the switch SwS1 inside the memory cell MC (the selected memory cell) and the word lines WL1 and WL2 corresponding to the other columns are set to a low-level potential.

The bit lines BL2 and BL3 that are connected to the memory cell MC (the selected cell) to which the writing is to be performed are selected. The selection is performed by the first bit line selection circuit 70BSa and the second bit line selection circuit 70BSb. The write current is supplied to the selected bit lines BL2 and BL3. The supply of the write current is performed by the first write circuit 70Wa and the second write circuit 70Wb. The write current flows from one of the first bit line selection circuit 70BSa or the second bit line selection circuit 70BSb toward the other of the first bit line selection circuit 70BSa or the second bit line selection circuit 70BSb. The magnetization direction of the memory layer (the second magnetic layer 12, etc.) of the MTJ element (the first stacked body SB1, etc.) is changeable by the write current. The magnetization direction of the memory layer of the MTJ element is changeable to the reverse direction recited above when the write current flows from the other of the first bit line selection circuit 70BSa or the second bit line selection circuit 70BSb toward the one of the first bit line selection circuit 70BSa or the second bit line selection circuit 70BSb. Thus, the writing is performed.

An example of the read operation of information from the memory cell MC will now be described.

The word line WL1 that is connected to the memory cell MC (the selected cell) from which the reading is to be performed is set to the high-level potential. The switch Sw1 inside the memory cell MC (the selected cell) recited above is set to the ON state. In such a case, the switch Sw1 is set to the ON state also for the other memory cells MC (the unselected cells) of the column including the memory cell MC (the selected cell) recited above. The word line WL2 that is connected to the gate of the switch SwS1 inside the memory cell MC (the selected cell) recited above and the word lines WL1 and WL2 that correspond to the other columns are set to the low-level potential.

The bit lines BL1 and BL3 that are connected to the memory cell MC (the selected cell) from which the reading is to be performed are selected. The selection is performed by the first bit line selection circuit 70BSa and the second bit line selection circuit 70BSb. A read current is supplied to the selected bit line BL1 and bit line BL3. The supply of the read current is performed by the first read circuit 70Ra and the second read circuit 70Rb. The read current flows from one of the first bit line selection circuit 70BSa or the second bit line selection circuit 70BSb toward the other of the first bit line selection circuit 70BSa or the second bit line selection circuit 70BSb. For example, the voltage between the selected bit lines BL1 and BL3 recited above is sensed by the first read circuit 70Ra and the second read circuit 70Rb. For example, the difference between the magnetization of the reference layer (the first magnetic layer 11) and the magnetization of the memory layer (the second magnetic layer 12) of the MTJ element is sensed. The difference includes the state in which the orientations of the magnetizations are parallel to each other (the same orientation) or antiparallel to each other (the reverse orientation). Thus, the read operation is performed.

FIGS. 28 to 39 are schematic views showing magnetic memory devices according to other embodiments.

As shown in FIGS. 28 to 39, in magnetic memory devices 110A, 111A, 112A, 120A, 121A, 122A, 130A, 131A, 132A, 210A, 211A, 212A, a layer 20M including MgO is provided between the second magnetic layer 12 and the third portion 20c of conductive layer 20. The thickness of the layer 20M including MgO is not less than 0.5 nm and not more than 1.5 nm, for example. It is preferable that the resistance area (RA) product is not more than 20 $\Omega\mu m^2$. It is more preferable that the resistance area product is not more than 10 $\Omega\mu m^2$.

The layer 20M may include at least one selected from the group consisting MgO, AlO, MgAlO, and MgGaO, for example. Providing the layer 20M can suppress a part of the current supplied to the conductive layer 20 to flow the second magnetic layer 12, for example. The write current can be reduced. The write operation can be stabilized, for example. A magnetic memory device can be provided in which a stable operation.

Figure 40:
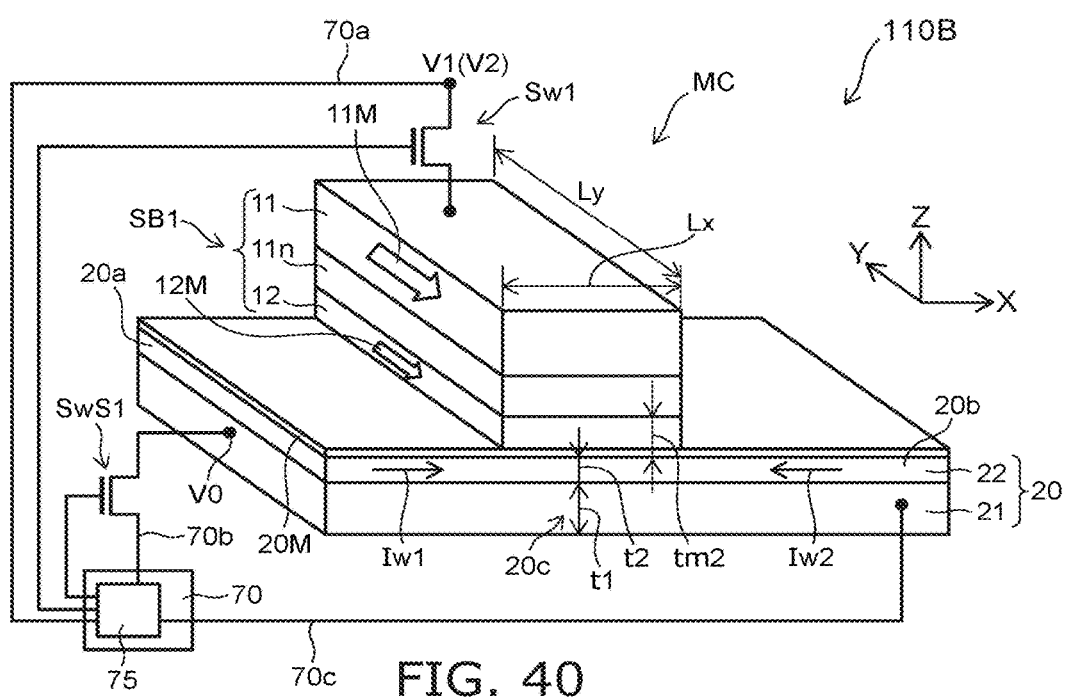
FIG. 40 is a schematic view showing a magnetic memory device according to other embodiments.

As shown in FIG. 40, in a magnetic memory 110B, the layer 20M is provided between the second magnetic layer 12 and the third portion 20c. Further, the layer 20M is provided on a regions of conductive layer 20 which does not overlap the second magnetic layer 12.

According to the embodiments, a magnetic memory device can be provided in which the write current can be reduced.

In this specification, the notation "first material/second material" means that the first material is positioned on the second material. For example, a layer of the first material is formed on a layer of the second material.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in magnetic memory devices such as magnetic layers, nonmagnetic layers, conductive layers, controllers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all magnetic memory devices practicable by an appropriate design modification by one skilled in the art based on the magnetic memory devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory device, comprising:
   a conductive layer including a first portion, a second portion, and a third portion between the first portion and the second portion;
   a first magnetic layer separated from the third portion in a first direction crossing a second direction, the second direction being from the first portion toward the second portion;
   a second magnetic layer provided between the third portion and the first magnetic layer; and
   a first nonmagnetic layer provided between the first magnetic layer and the second magnetic layer,
   the third portion including a first region and a second region, the second region being provided between the first region and the second magnetic layer and including a first metal and boron,
   the first region not including boron, or a first concentration of boron in the first region being lower than a second concentration of boron in the second region,
   a thickness along the first direction of the second region being not less than 1 nanometer and not more than 7 nanometers,
   wherein
   the conductive layer further includes a third region and a fourth region,
   the second region is between the third region and the fourth region in the second direction, and
   the third region and the fourth region do not include boron, or a concentration of boron in the third region and a concentration of boron in the fourth region each are lower than the second concentration.

2. The device according to claim 1, wherein the first region includes the first metal.

3. The device according to claim 1, wherein the second magnetic layer does not include boron, or the second magnetic layer includes boron and has a concentration of boron lower than the second concentration.

4. The device according to claim 1, wherein at least a portion of the second region is amorphous.

5. The device according to claim 1, wherein the concentration of boron in the second magnetic layer is 30 atomic percent or less.

6. The device according to claim 1, wherein the first metal includes at least one selected from the group consisting of Ta, W, Re, Os, Ir, Pt, Au, Cu, Ag, and Pd.

7. The device according to claim 1, wherein the second concentration of boron is not less than 5 atomic percent.

8. The device according to claim 1, wherein
   the first region extends along the second direction between the first portion and the second portion, and
   the second region extends along the second direction between the first portion and the second portion.

9. The device according to claim 1, wherein
   the second region further includes oxygen, and
   a concentration of oxygen in the second region is not less than 5 atomic percent and not more than 15 atomic percent.

10. The device according to claim 1, further comprising:
    a controller electrically connected to the first portion and the second portion,
    the controller implementing
      a first operation of supplying a first current to the conductive layer from the first portion toward the second portion, and
      a second operation of supplying a second current to the conductive layer from the second portion toward the first portion,
    wherein
    the controller is further electrically connected to the first magnetic layer,
    the controller further implements a third operation and a fourth operation,
    in the first operation, the controller sets a potential difference between the first portion and the first magnetic layer to a first voltage,
    in the second operation, the controller sets the potential difference between the first portion and the first magnetic layer to the first voltage,
    in the third operation, the controller sets the potential difference between the first portion and the first magnetic layer to a second voltage and supplies the first current to the conductive layer,
    in the fourth operation, the controller sets the potential difference between the first portion and the first magnetic layer to the second voltage and supplies the second current to the conductive layer,
    the first voltage is different from the second voltage,
    the first operation causes a memory cell to be in a first memory state, the memory cell includes the first magnetic layer, the first nonmagnetic layer, and the second magnetic layer,
    the second operation causes the memory cell to be in a second memory state, and a memory state of the memory cell substantially does not change between before and after the third operation, and substantially does not change between before and after the fourth operation.

11. The device according to claim 1, wherein the second region further includes hafnium.

12. A magnetic memory device, comprising:
a conductive layer including a first portion, a second portion, and a third portion between the first portion and the second portion;
a first magnetic layer separated from the third portion in a first direction crossing a second direction, the second direction being from the first portion toward the second portion;
a second magnetic layer provided between the third portion and the first magnetic layer; and
a first nonmagnetic layer provided between the first magnetic layer and the second magnetic layer,
the third portion including a first region and a second region, the first region including a first metal, the second region being provided between the first region and the second magnetic layer and including the first metal and boron,
the first region not including boron, or a first concentration of boron in the first region being lower than a second concentration of boron in the second region,
wherein
the conductive layer further includes a third region and a fourth region,
the second region is between the third region and the fourth region in the second direction, and
the third region and the fourth region do not include boron, or a concentration of boron in the third region and a concentration of boron in the fourth region each are lower than the second concentration.

13. The device according to claim 12, wherein a thickness along the first direction of the second region is not less than 1 nanometer and not more than 7 nanometers.

14. The device according to claim 12, wherein the second magnetic layer does not include boron, or the second magnetic layer includes boron and has a concentration of boron lower than the second concentration.

15. The device according to claim 12, further comprising a controller electrically connected to the first portion and the second portion,
the controller implementing
a first operation of supplying a first current to the conductive layer from the first portion toward the second portion, and
a second operation of supplying a second current to the conductive layer from the second portion toward the first portion,
wherein
the controller is further electrically connected to the first magnetic layer,
the controller further implements a third operation and a fourth operation,
in the first operation, the controller sets a potential difference between the first portion and the first magnetic layer to a first voltage,
in the second operation, the controller sets the potential difference between the first portion and the first magnetic layer to the first voltage,
in the third operation, the controller sets the potential difference between the first portion and the first magnetic layer to a second voltage and supplies the first current to the conductive layer,
in the fourth operation, the controller sets the potential difference between the first portion and the first magnetic layer to the second voltage and supplies the second current to the conductive layer,
the first voltage is different from the second voltage,
the first operation causes a memory cell to be in a first memory state, the memory cell includes the first magnetic layer, the first nonmagnetic layer, and the second magnetic layer,
the second operation causes the memory cell to be in a second memory state, and
a memory state of the memory cell substantially does not change between before and after the third operation, and substantially does not change between before and after the fourth operation.

16. A magnetic memory device, comprising:
a conductive layer including a first portion, a second portion, and a third portion between the first portion and the second portion;
a first magnetic layer separated from the third portion in a first direction crossing a second direction, the second direction being from the first portion toward the second portion;
a second magnetic layer provided between the third portion and the first magnetic layer;
a first nonmagnetic layer provided between the first magnetic layer and the second magnetic layer;
a first boron compound region including an oxide including boron; and
a second boron compound region including an oxide including boron,
the third portion including a first region and a second region, the second region being provided between the first region and the second magnetic layer and including a first metal and boron,
the first region not including boron, or a first concentration of boron in the first region being lower than a second concentration of boron in the second region,
a thickness along the first direction of the second region being not less than 1 nanometer and not more than 7 nanometers,
the first magnetic layer being between the first boron compound region and the second boron compound region in the second direction,
the first nonmagnetic layer being between the first boron compound region and the second boron compound region in the second direction,
the second magnetic layer being between the first boron compound region and the second boron compound region in the second direction.

17. A magnetic memory device, comprising:
a conductive layer including a first portion, a second portion, and a third portion between the first portion and the second portion;
a first magnetic layer separated from the third portion in a first direction crossing a second direction, the second direction being from the first portion toward the second portion;
a second magnetic layer provided between the third portion and the first magnetic layer; and
a first nonmagnetic layer provided between the first magnetic layer and the second magnetic layer,
the third portion including a first region and a second region, the second region being provided between the first region and the second magnetic layer and including a first metal and boron, the first region not including boron, or a first concentration of boron in the first region being lower than a second concentration of boron in the second region, a thickness along the first direction of the second region being not less than 1 nanometer and not more than 7 nanometers, wherein the second region includes a first partial region and a second partial region, the second partial region being provided between the first partial region and the first region, and a composition of the first partial region is different from a composition of the second partial region.

18. A magnetic memory device, comprising:

a conductive layer including a first portion, a second portion, and a third portion between the first portion and the second portion;

a first magnetic layer separated from the third portion in a first direction crossing a second direction, the second direction being from the first portion toward the second portion;

a second magnetic layer provided between the third portion and the first magnetic layer;

a first nonmagnetic layer provided between the first magnetic layer and the second magnetic layer; and a controller electrically connected to the first portion and the second portion, the third portion including a first region and a second region, the second region being provided between the first region and the second magnetic layer and including a first metal and boron, the first region not including boron, or a first concentration of boron in the first region being lower than a second concentration of boron in the second region, a thickness along the first direction of the second region being not less than 1 nanometer and not more than 7 nanometers, the controller implementing a first operation of supplying a first current to the conductive layer from the first portion toward the second portion, and a second operation of supplying a second current to the conductive layer from the second portion toward the first portion, wherein the controller is further electrically connected to the first magnetic layer, the controller further implements a third operation and a fourth operation, in the first operation, the controller sets a potential difference between the first portion and the first magnetic layer to a first voltage, in the second operation, the controller sets the potential difference between the first portion and the first magnetic layer to the first voltage, in the third operation, the controller sets the potential difference between the first portion and the first magnetic layer to a second voltage and supplies the first current to the conductive layer, in the fourth operation, the controller sets the potential difference between the first portion and the first magnetic layer to the second voltage and supplies the second current to the conductive layer, the first voltage is different from the second voltage, a first electrical resistance between the first magnetic layer and the first portion after the first operation is different from a second electrical resistance between the first magnetic layer and the first portion after the second operation, and the absolute value of a difference between the first electrical resistance and the second electrical resistance is greater than the absolute value of a difference between a third electrical resistance and a fourth electrical resistance, the third electrical resistance being between the first magnetic layer and the first portion after the third operation, the fourth electrical resistance being between the first magnetic layer and the first portion after the fourth operation.

19. A magnetic memory device, comprising:

a conductive layer including a first portion, a second portion, and a third portion between the first portion and the second portion;

a first magnetic layer separated from the third portion in a first direction crossing a second direction, the second direction being from the first portion toward the second portion;

a second magnetic layer provided between the third portion and the first magnetic layer;

a first nonmagnetic layer provided between the first magnetic layer and the second magnetic layer; and a controller electrically connected to the first portion and the second portion, the third portion including a first region and a second region, the first region including a first metal, the second region being provided between the first region and the second magnetic layer and including the first metal and boron, the first region not including boron, or a first concentration of boron in the first region being lower than a second concentration of boron in the second region, the controller implementing a first operation of supplying a first current to the conductive layer from the first portion toward the second portion, and a second operation of supplying a second current to the conductive layer from the second portion toward the first portion, wherein the controller is further electrically connected to the first magnetic layer, the controller further implements a third operation and a fourth operation, in the first operation, the controller sets a potential difference between the first portion and the first magnetic layer to a first voltage, in the second operation, the controller sets the potential difference between the first portion and the first magnetic layer to the first voltage, in the third operation, the controller sets the potential difference between the first portion and the first magnetic layer to a second voltage and supplies the first current to the conductive layer, in the fourth operation, the controller sets the potential difference between the first portion and the first magnetic layer to the second voltage and supplies the second current to the conductive layer, the first voltage is different from the second voltage, a first electrical resistance between the first magnetic layer and the first portion after the first operation is different from a second electrical resistance between the first magnetic layer and the first portion after the second operation, and the absolute value of a difference between the first electrical resistance and the second electrical resistance is greater than the absolute value of a difference between a third electrical resistance and a fourth electrical resistance, the third electrical resistance being between the first magnetic layer and the first portion after the third operation, the fourth electrical resistance being between the first magnetic layer and the first portion after the fourth operation.

* * * * *